(12) United States Patent
Pan

(10) Patent No.: US 11,239,944 B1
(45) Date of Patent: Feb. 1, 2022

(54) METHODS AND DEVICES FOR RATE ADAPTIVE FORWARD ERROR CORRECTION USING A FLEXIBLE IRREGULAR ERROR CORRECTING CODE

(71) Applicant: Chunpo Pan, Ottawa (CA)

(72) Inventor: Chunpo Pan, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/994,103

(22) Filed: Aug. 14, 2020

(51) Int. Cl.
| | |
|---|---|
| *H04L 1/00* | (2006.01) |
| *H03M 13/29* | (2006.01) |
| *H03M 13/25* | (2006.01) |
| *H03M 13/00* | (2006.01) |
| *H03M 13/15* | (2006.01) |
| *H03M 13/11* | (2006.01) |

(52) U.S. Cl.
CPC ....... *H04L 1/0041* (2013.01); *H03M 13/1177* (2013.01); *H03M 13/1575* (2013.01); *H03M 13/251* (2013.01); *H03M 13/2942* (2013.01); *H03M 13/6516* (2013.01)

(58) Field of Classification Search
CPC .................................................... H04L 1/0041
See application file for complete search history.

(56) References Cited

U.S. PATENT DOCUMENTS

| | | | | |
|---|---|---|---|---|
| 6,226,769 | B1 * | 5/2001 | Schuster | H03M 13/2703 |
| | | | | 714/752 |
| 6,934,305 | B1 * | 8/2005 | Duschatko | H04L 45/583 |
| | | | | 370/503 |
| 7,555,695 | B2 * | 6/2009 | Oogami | H04L 1/0041 |
| | | | | 714/758 |
| 2007/0153724 | A1 * | 7/2007 | Cheon | H04L 1/0065 |
| | | | | 370/328 |
| 2012/0266051 | A1 | 10/2012 | Farhoodfar et al. | |
| 2018/0011762 | A1 * | 1/2018 | Klein | G06F 11/1072 |
| 2019/0036550 | A1 | 1/2019 | Koike-Akino | |

FOREIGN PATENT DOCUMENTS

| | | |
|---|---|---|
| CN | 101919191 | 12/2010 |
| CN | 103430455 | 12/2013 |
| CN | 110999092 | 4/2020 |

OTHER PUBLICATIONS

P. Elias, "Error-free coding," IEEE Trans. Inf. Theory, vol. 4, No. 4, pp. 29-37, Sep. 1954.

(Continued)

*Primary Examiner* — Joseph D Torres

(57) ABSTRACT

Methods and devices for performing rate adaptive forward error correction using a flexible irregular error-correcting code, such as a staircase code. Each codeword of the ECC uses one of two or more different encodings, each encoding having a different number of parity bits. By adjusting the proportions of codewords of each encoding included in a data block, the FEC overhead can be finely adjusted, achieving flexible levels of FEC overhead in response to increased or decreased noise or perturbations in a communication channel. Three types of flexible irregular zipper codes are described: general zipper codes, staircase codes, and oFEC codes.

18 Claims, 8 Drawing Sheets

(56) References Cited

OTHER PUBLICATIONS

M. Alipour, O. Etesami, G. Maatouk and A. Shokrollahi, "Irregular product codes," 2012 IEEE Information Theory Workshop, Lausanne, 2012, pp. 197-201.

B. Smith, A. Farhood, A. Hunt, F. Kschischang, and J. Lodge, "Staircase Codes: FEC for 100 Gb/s OTN," J. Lightwave Technol. 30, 110-117 (2012).

J. Cho and P. J. Winzer, "Probabilistic Constellation Shaping for Optical Fiber Communications," in Journal of Lightwave Technology, vol. 37, No. 6, pp. 1590-1607, 15 Mar. 15, 2019.

A. Y. Sukmadji, U. Martínez-Peñas and F. R. Kschischang, "Zipper Codes: Spatially-Coupled Product-Like Codes with Iterative Algebraic Decoding," 2019 16th Canadian Workshop on Information Theory (CWIT), Hamilton, ON, Canada, 2019, pp. 1-6.

R. M. Pyndiah, "Near-optimum decoding of product codes: block turbo codes," in IEEE Transactions on Communications, vol. 46, No. 8, pp. 1003-1010, Aug. 1998.

Qualcomm Incorporated et al.,"EMM-EFEC: Minor Updates to 6330 Code Submission ",3GPP TSG-SA4#71 Nov. 5-9, 2012 Bratislava, Slovakia,S4-121462,total:22pages.

International Search Report dated Jul. 5, 2021, PCT/CN2021/085484.

\* cited by examiner

METHODS AND DEVICES FOR RATE ADAPTIVE FORWARD ERROR CORRECTION USING A FLEXIBLE IRREGULAR ERROR CORRECTING CODE

RELATED APPLICATIONS

This is the first patent application related to this matter.

FIELD

The present disclosure is related to forward error correction in digital communications, and in particular to methods and devices for rate adaptive forward error correction using a flexible irregular error correcting code.

BACKGROUND

Most modern fiber-optic communication systems employ forward-error-correction (FEC) to protect data from channel perturbations and noise. In a typical FEC configuration, a redundancy overhead is added to the payload data at the transmitter side, using an encoding called an error correcting code (ECC). The ECC allows for errors to be detected and corrected, up to a certain threshold, at the receiver side. The threshold depends on the amount and type of coding overhead and the type of error pattern. A higher bit error rate (BER) threshold improves error correction performance but may introduce higher error correction overhead to the ECC and therefore lower data throughput. Overhead is introduced to the ECC in the form of error correction bits added to each block of data bits during ECC encoding. The higher the ratio of non-data bits to data bits in a given block of the output signal, the higher the overhead and the lower the throughput.

Typically, a FEC module achieves error correction by performing an error detection check on a single bit sequence of the received signal. The bit sequence includes a plurality of data bits of payload data and one or more non-data bits added by the ECC encoding process, such as parity bits. Parity bits are set by the ECC encoder at the transmitter based on the bit values of the data bits in the sequence according to a mathematical calculation. The FEC module at the receiver can perform a corresponding mathematical calculation using the received data bits and parity bits of the sequence to confirm whether the bit sequence constitutes an ECC codeword, i.e. whether the bit sequence complies with the ECC encoding scheme and therefore contains no bit errors. If the calculation performed by the receiver indicates that bit errors are present, the parity bits can typically also be used by the FEC module to locate the specific bit errors present in the bit sequence and thereby flip those bits to correct the bit errors.

The BER threshold is typically defined, in optical communication systems, as the maximum input BER (i.e. the BER of the received signal) at which the output BER (i.e. the BER of the error-corrected output signal) remains below 1e-15. Given a target input BER threshold, an optimally efficient FEC would use the minimum amount of overhead (OH) to correct the target number of errors. In some instances, overhead is constant per codeword: the ECC encoder at the transmitter encodes a codeword by adding a fixed number of payload data bits to a fixed number of parity bits. Using a higher number of parity bits relative to the number of data bits in the codeword increases overhead but may allow for more bit errors to be detected and/or corrected per bit sequence.

Some modern optical modems are able to accommodate a range of transmission distances and channel conditions. Various techniques are used to achieve such flexibility, such as different quadrature amplitude modulation (QAM) constellation designs (e.g., from 16 QAM to 64 QAM to 128 QAM), and probabilistic constellation shaping (PCS). These techniques, applied to various optical channel noise levels, lead to a range of different input BER levels at the receiver, and therefore require variable and adaptable levels of FEC overhead in order to achieve high spectral efficiency.

In PCS, the constellation points have unequal probabilities of being transmitted. This may be achieved by having unequal numbers of 0's and 1's in the data bits and using a systematic FEC which preserves the information bits in the encoded sequence (with unequal numbers of 0's and 1's). In this case, the mapping function sees different constellation point labels with unequal probabilities, and therefore outputs constellation points with unequal probabilities. This allows some designs to transmit the constellation points with low magnitude (i.e. low energy) more frequently than the constellation points with high magnitude (i.e. high energy). Thus, given a constant signal-to-noise ratio (SNR), the Euclidean distance between the constellation points is greater compared to uniform constellation distribution, the input BER at the receiver is reduced accordingly, and the FEC overhead can be reduced. However, by limiting the number of 0's and 1's in the data bits, the entropy of the data bit sequence is reduced, and the effective data rate (i.e. throughput) is sacrificed. To achieve an optimal data rate, the PCS distributions must be configured in accordance with different channel conditions in order to balance PCS and FEC overhead. With the optimal PCS design, the required FEC overhead varies as a function of the channel SNR and optical transmission distance, as demonstrated by J. Cho and P. J. Winzer, "Probabilistic Constellation Shaping for Optical Fiber Communications", Journal of Lightwave Technology, vol. 37, no. 6, pp. 1590-1607, 15 Mar. 2019, which is hereby incorporated by reference in its entirety.

A number of approaches have been made to achieving variable FEC overhead in optical modems. However, each existing approach has various drawbacks.

A first approach is referred to as shortening. A modem is used having a single FEC module with a fixed overhead. One may achieve higher overhead and higher error-correcting capability by shortening the number of data bits included in each codeword (i.e. shortening the data bit sequence included in the codeword), or achieve a lower overhead and lower error-correcting capability by puncturing the FEC.

To shorten a FEC, certain bit positions in a codeword are fixed in value (e.g., 0) prior to the transmission, with these positions being known to both the transmitter and the receiver. Therefore, the bits in these locations do not need to be transmitted, and are set to the fixed value directly at the receiver. Since these locations cannot be used to transmit any payload data, the number of data bits per codeword is decreased relative to the fixed number of parity bits, and therefore the effective overhead of the FEC increased. However, since these bit locations will not have errors, the number of potentially erroneous data bits is decreased relative to the fixed number of parity bits per codeword, such that the effective tolerable input BER is also increased.

To puncture a FEC, certain bit positions in a codeword, after encoding, are omitted from the transmission, with the positions known to both the transmitter and receiver. The receiver FEC treats these locations as erasures while performing decoding. The process reduces the number of bits transmitted over the channel for a given bit sequence, lowers the effective overhead, and lowers the tolerable input BER.

Shortening and puncturing have a number of drawbacks. The shortened or punctured FEC module typically has worse performance compared to a FEC module specifically designed for the same effectively overhead. Furthermore, shortening and puncturing both change the transmitted number of bits for a given codeword. Hence, different overhead levels require different transmitted block lengths, different framing structures, and different buffer sizes at the receiver. This imposes additional complexity in hardware implementations.

A second approach to variable FEC overhead is to use a modem having several FEC modules, each designed to target a different input BER. The drawbacks of having several such FEC modules is the high complexity imposed on both the FEC design and the modem implementation. This high complexity constrains the number of FEC modules that can be included in the modem, which leads to a limited number of FEC overhead levels that can be supported.

There thus exists a need for an ECC encoding and decoding scheme having variable FEC overhead that overcomes one or more of the drawbacks of the existing approaches.

SUMMARY

In various embodiments described herein, methods and devices are disclosed that provide rate adaptive forward error correction using a flexible irregular error-correcting code, such as a staircase code. In some embodiments, each codeword of the ECC uses one of two or more different encodings, each encoding having a different number of parity bits. By adjusting the proportions of codewords of each encoding included in a data block, the FEC overhead can be finely adjusted in some examples, achieving flexible levels of FEC overhead in response to increased or decreased noise or perturbations in a communication channel.

Some embodiments may overcome one or more of the drawbacks of the existing approaches described above. In some examples, each ECC codeword has a fixed length but a reconfigurable division between data bits and parity bits, thereby providing a tunable or variable level of FEC overhead without requiring different transmitted block lengths, different framing structures, or different buffer sizes at the receiver, and without incurring the performance losses resulting from shortening or puncturing. In some examples, a small number of encodings (such as two or three) with distinct FEC overhead levels are used, thereby requiring only a small number of FEC decoding units, but a given data block can include a mix of codewords of each encodings in different proportions to achieve a highly granular level of desired overall FEC overhead per data block. In some examples, a single gated FEC decoder can be used by the receiver to perform FEC on each of two or more encodings, thereby minimizing the complexity associated with multiple parallel FEC modules. Other potential advantages may be appreciated based on the disclosure as a whole.

As described herein, a "signal" or "data signal" may refer to a digital signal containing some number of payload data bits (also called "data bits" or "information bits") as well as, optionally, some number of ECC bits (also called "parity bits" or "overhead bits") used for performing FEC decoding, error detection, and error correction. The bits of a signal may be visualized as being organized into two-dimensional "data blocks" according to an organizational scheme known to (i.e., mutually predetermined by) both the transmitter and receiver. An ongoing signal may thus constitute a stream of bits, the stream of bits being periodically organized into data blocks by an encoder or a decoder. The bits of a signal may thus be conceived of as a sequence of data blocks that are transmitted and/or received, even if the constituent bits are transmitted and/or received as a linear sequence of bits. A sequence of data blocks may be transmitted, for example, starting with an initial data block, and followed by a subsequent data block in the sequence; the initial data block may thus be regarded as a "prior" data block in the sequence relative to the subsequent data block. This relationship of prior and subsequent data blocks continues to hold as each further subsequent data block is encoded, decoded, transmitted, and/or received.

As used herein, an error correcting code (ECC) is a code used for error correction. Different types of ECCs are encoded and decoded according to different FEC encoding and decoding schemes. Example FEC encoding and decoding schemes are described herein for encoding and decoding ECCs. Examples of ECCs include zipper codes and product codes. Zipper codes include staircase codes and oFEC (open forward error correction) codes as special cases, but zipper codes may also be described in general terms.

A "bit error" (or simply "error") may refer to a bit of a signal that has been corrupted by noise or other impairment in transit across a communication channel, yielding a different bit value as detected at the receiver than the corresponding bit value set by the transmitter.

As used herein, statements that a second item (e.g., a signal, value, scalar, vector, matrix, calculation, or bit sequence) is "based on" a first item may mean that characteristics of the second item are affected or determined at least in part by characteristics of the first item. The first item may be considered an input to an operation or calculation, or a series of operations or calculations, that produces the second item as an output that is not independent from the first item.

Data blocks as described herein may be conceptualized as two-dimensional bit arrays in the context of staircase codes. Some data blocks (called "row-wise" data blocks) may be organized as a sequence of codewords corresponding to rows of the data block, whereas other data blocks (called "column-wise" data blocks) may be organized as a sequence of codewords corresponding to columns of the data block. All operations and characteristics described herein with respect to data blocks may refer to rows of a row-wise data block or columns of a column-wise data block; unless otherwise indicated, these references will be appreciated to apply equally to both types of data blocks, with row and column references replaced with their counterparts as appropriate. Thus, references to rows or columns in a given example are arbitrary; row-wise and column-wise data blocks may be encoded and decoded according to identical principles in some embodiments.

As used herein, a "coded bit sequence" may refer to a bit sequence of a data block of an encoded ECC containing both parity bits and data bits, such as a row or column of a data block of a staircase code, a real buffer of a codeword of a zipper code, or a horizontal portion of a codeword of an oFEC code.

The term "codeword", sometimes understood in the context of FEC to mean a well-formed (i.e. error-free) encoded bit sequence of an ECC, may be used herein to mean both valid (i.e. error-free) and invalid (i.e., containing errors) codewords. An invalid codeword may be a valid codeword with bit errors introduced, e.g., as a result of transmission.

In FEC decoding, it may be unknown whether a given codeword is invalid or valid before it is decoded.

In the context of zipper and oFEC codes, the meaning of the terms "data block", "prior data block", and "coded bit sequence" are defined below in reference to FIGS. 7A, 7B, and 8.

Unless otherwise indicated, parity check matrices are described herein as numerical format matrices, not binary format matrices, such that the entries of the parity check matrix are numbers of a Galois field, not individual bits. Thus, when a parity check matrix is described as having a given number of rows, this refers to the Galois field number representation of the matrix, not a binary representation of the matrix.

According to a first aspect, the disclosure provides a method. A digital data signal is received by a forward error correction (FEC) encoder of a transmitter, comprising a plurality of data bits. A FEC enabled data signal is generated by the FEC encoder. The FEC enabled data signal comprises a sequence of data blocks. Each data block comprises a plurality of coded bit sequences. Each coded bit sequence comprises a data bit sequence comprising one or more of the data bits and a parity bit sequence comprising one or more parity bits. Each parity bit sequence is based on its respective data bit sequence and one or more bits of a prior data block. Each data block includes at least one parity bit sequence of a first encoding and at least one parity bit sequence of a second encoding. Each parity bit sequence of the first encoding has a first predetermined number of parity bits. Each parity bit sequence of the second encoding has a second predetermined number of parity bits greater than the first predetermined number. (A number is "predetermined" when it is defined or otherwise decided upon in any fashion at any time prior to the time the number is applied.) The FEC-enabled data signal is transmitted.

In some examples, the FEC enabled data signal is encoded as a staircase code. The sequence of data blocks alternates between row-wise data blocks and column-wise data blocks. The plurality of coded bit sequences of each row-wise data block comprise a plurality of rows. The plurality of rows define a plurality of columns. Each parity bit sequence is based on its respective data bit sequence and a corresponding row of a prior column-wise data block. The plurality of coded bit sequences of each column-wise data block comprise a plurality of columns. The plurality of columns define a plurality of rows. Each parity bit sequence is based on its respective data bit sequence and a corresponding column of a prior row-wise data block.

In some examples, at least one data block of the sequence of data blocks contains at least one parity bit sequence of a third encoding, each parity bit sequence of the third encoding having a third predetermined number of parity bits greater than the second predetermined number.

In some examples, each data block of the sequence of data blocks includes a first number of parity bit sequences of the first encoding, a second number of parity bit sequences of the second encoding, and a third number of parity bit sequences of the third encoding. The first number, second number, and third number are determined based on a target error correction overhead level. The method further comprises receiving channel condition information, updating the target error correction overhead level based on the channel condition information, and changing the first number, second number, and third number based on the updated target error correction overhead level.

In some examples, for each data block, the parity bit sequences of each encoding are distributed among the rows or columns such that a number of adjacent parity bit sequences of the same encoding is minimized.

In some examples, each row-wise data block has the same distribution of parity bit sequences of each encoding among its rows, and each column-wise data block has the same distribution of parity bit sequences of each encoding among its columns.

In some examples, the method further comprises generating a parity bit sequence in a row-wise data block. A binary vector is identified, comprising an unknown parity bit sequence, the data bits of the row of the parity bit sequence in the row-wise data block, and the bits of the corresponding row of the prior column-wise data block. A valid parity bit sequence is identified such that, by setting the unknown parity bit sequence to the valid parity bit sequence and multiplying the binary vector by a transpose of a parity check matrix to generate a syndrome, the syndrome comprising a vector having a number of elements equal to a number of rows of the parity check matrix, each element of the syndrome is equal to zero. The parity bit sequence is set to the valid parity bit sequence.

In some examples, the parity bit sequence is of the first encoding. The parity check matrix comprises a one row matrix defined by a primitive element a of a Galois field such that the first element of the parity check matrix is one, and each subsequent element of the parity check matrix is a times the previous element.

In some examples, the parity bit sequence is of the second encoding. The parity check matrix comprises a two row matrix defined by a primitive element a of a Galois field such that the first element of the first row of the parity check matrix is one, each subsequent element of the first row of the parity check matrix is a times the previous element, the first element of the second row of the parity check matrix is one, and each subsequent element of the second row of the parity check matrix is a3 times the previous element.

In some examples, the parity bit sequence is of the third encoding. The parity check matrix comprises a three row matrix defined by a primitive element a of a Galois field such that the first element of the first row of the parity check matrix is one, each subsequent element of the first row of the parity check matrix is a times the previous element, the first element of the second row of the parity check matrix is one, each subsequent element of the second row of the parity check matrix is a3 times the previous element, the first element of the third row of the parity check matrix is one, and each subsequent element of the third row of the parity check matrix is a5 times the previous element.

According to a further aspect, the disclosure provides a method. A forward error correction (FEC) enabled received signal is received by a FEC decoder of a receiver. The FEC enabled received signal comprises a sequence of data blocks. Each data block comprises a plurality of coded bit sequences. Each coded bit sequence comprises a data bit sequence comprising one or more data bits and a parity bit sequence comprising one or more parity bits. Each data block includes at least one parity bit sequence of a first encoding and at least one parity bit sequence of a second encoding. Each parity bit sequence of the first encoding has a first predetermined number of parity bits. Each parity bit sequence of the second encoding has a second predetermined number of parity bits greater than the first predetermined number. For each coded bit sequence of each received data block, a parity check is performed by the FEC decoder using the parity bit sequence of the coded bit sequence to detect at least one bit error in a prior data block.

In some examples, the sequence of data blocks alternates between row-wise data blocks and column-wise data blocks. The plurality of coded bit sequences of each row-wise data block comprise a plurality of rows. Each row comprises a data bit sequence comprising one or more of the data bits and a parity bit sequence comprising one or more parity bits. The plurality of rows defines a plurality of columns. The plurality of coded bit sequences of each column-wise data block comprise a plurality of columns. Each column comprises a data bit sequence comprising one or more of the data bits and a parity bit sequence comprising one or more parity bits. The plurality of columns define a plurality of rows. Performing a parity check using the parity bit sequence of a row of a row-wise data block comprises using the parity bit sequence to detect at least one bit error in the corresponding row of a prior column-wise data block. Performing a parity check using the parity bit sequence of a column of a column-wise data block comprises using the parity bit sequence to detect at least one bit error in the corresponding column of a prior row-wise data block.

In some examples, at least one data block of the sequence of data blocks contains at least one parity bit sequence of a third encoding, each parity bit sequence of the third encoding having a third predetermined number of parity bits greater than the second predetermined number.

In some examples, each row-wise data block has the same distribution of parity bit sequences of each encoding among its rows, and each column-wise data block has the same distribution of parity bit sequences of each encoding among its columns.

In some examples, detecting a bit error in the corresponding row of the prior column-wise data block using a parity bit sequence comprises identifying a binary vector comprising the parity bit sequence, the data bits of the row of the row-wise data block, and the bits of the corresponding row of the prior column-wise data block. The binary vector is multiplied by a transpose of a parity check matrix to generate a syndrome. The syndrome comprises a vector having a number of elements equal to a number of rows of the parity check matrix. Based on the elements of the syndrome, the binary vector is determined to contain at least one bit error.

In some examples, the parity bit sequence is of the first encoding. The parity check matrix comprises a one row matrix defined by a primitive element a of a Galois field such that the first element of the parity check matrix is one, and each subsequent element of the parity check matrix is a times the previous element. The method further comprises, in response to determining that the first element of the syndrome is not zero, using a syndrome decoder module of the FEC decoder to correct the one or more detected errors. The syndrome decoder module is configured to provide the first element of the syndrome to a one-error decoder unit of the FEC decoder, use the one-error decoder unit to locate a single bit error in the binary vector based on the first element of the syndrome, and correct the single bit error.

In some examples, the parity bit sequence is of the second encoding. The parity check matrix comprises a two row matrix defined by a primitive element a of a Galois field such that the first element of the first row of the parity check matrix is one, each subsequent element of the first row of the parity check matrix is a times the previous element, the first element of the second row of the parity check matrix is one, and each subsequent element of the second row of the parity check matrix is a3 times the previous element. The method further comprises, in response to determining that the first element or second element of the syndrome is not zero, using a syndrome decoder module of the FEC decoder to correct the one or more detected errors. The syndrome decoder module is configured to calculate a value D3 by adding the cube of the first element of the syndrome to the second element of the syndrome. If D3 is zero, the syndrome decoder module is configured to provide the first element of the syndrome to a one-error decoder unit of the FEC decoder, use the one-error decoder unit to locate a single bit error in the binary vector based on the first element of the syndrome, and correct the single bit error. If D3 is not zero, the syndrome decoder module is configured to provide the first and second elements of the syndrome to a two-error decoder unit of the FEC decoder, use the two-error decoder unit to locate two bit errors in the binary vector based on the first element of the syndrome, and correct the two bit errors.

In some examples, the parity bit sequence is of the third encoding. The parity check matrix comprises a three row matrix defined by a primitive element a of a Galois field such that the first element of the first row of the parity check matrix is one, each subsequent element of the first row of the parity check matrix is a times the previous element, the first element of the second row of the parity check matrix is one, each subsequent element of the second row of the parity check matrix is a3 times the previous element, the first element of the third row of the parity check matrix is one, and each subsequent element of the third row of the parity check matrix is a5 times the previous element. The method further comprises, in response to determining that any of the three elements of the syndrome is not zero, using a syndrome decoder module of the FEC decoder to correct the one or more detected errors. The syndrome decoder module is configured to calculate a value D3 by adding the cube of the first element of the syndrome to the second element of the syndrome. If D3 is zero, the syndrome decoder module is configured to provide the first element of the syndrome to a one-error decoder unit of the FEC decoder, use the one-error decoder unit to locate a single bit error in the binary vector based on the first element of the syndrome, and correct the single bit error. If D3 is not zero, the syndrome decoder module is configured to calculate a value D5 by adding the first element of the syndrome, raised to the fifth power, to the third element of the syndrome, if the first element of the syndrome, multiplied by D5, is equal to the second element of the syndrome, multiplied by D3 provide the first and second elements of the syndrome to a two-error decoder unit of the FEC decoder, use the two-error decoder unit to locate two bit errors in the binary vector based on the first and second elements of the syndrome, and correct the two bit errors. If the first element of the syndrome, multiplied by D5, is not equal to the second element of the syndrome, multiplied by D3, or the first element of the syndrome is equal to zero, the syndrome decoder module is configured to provide the first, second, and third elements of the syndrome to a three-error decoder unit of the FEC decoder, use the three-error decoder unit to locate three bit errors in the binary vector based on the first, second, and third elements of the syndrome, and correct the three bit errors.

In some examples, the syndrome decoder module is a gated syndrome decoder module further configured to detect and correct bit errors in the data bit sequence of a row of a row-wise data block or in the corresponding row of the prior column-wise data block using a parity bit sequence of the first encoding or second encoding.

According to a further aspect, a forward error correction (FEC) decoder is provided. The FEC decoder comprises a syndrome generation module configured to receive a forward error correction (FEC) enabled received signal. The FEC enabled signal comprises a sequence of data blocks. The syndrome generation module is configured to, for a coded bit sequence of a received data block, perform a parity check using a parity bit sequence of the coded bit sequence to detect any bit errors in a binary vector based on one or more elements of a calculated syndrome. The binary vector comprises the parity bit sequence, the data bit sequence of the coded bit sequence, and one or more bits of a prior data block. The FEC decoder comprises a gated syndrome decoder module comprising a first decoder unit and a second decoder unit. The gated syndrome decoder module is configured, in response to the syndrome generation module detecting one or more bit errors, to perform several steps. If a first number of bit errors are detected based on the syndrome, or if the parity bit sequence is encoded using a first encoding provide at least one element of the syndrome to the first decoder unit, the gated syndrome decoder module is configured to use the first decoder unit to locate the bit errors in the binary vector based on the syndrome, and correct the bit errors. If a second number of bit errors are detected based on the syndrome, and if the parity bit sequence is encoded using a second encoding, the second number being greater than the first number, the gated syndrome decoder module is configured to provide at least one element of the syndrome to the second decoder unit, use the second decoder unit to locate the bit errors in the binary vector based on the syndrome, and correct the bit errors.

BRIEF DESCRIPTION OF THE DRAWINGS

Reference will now be made, by way of example, to the accompanying drawings which show example embodiments of the present application, and in which.

Similar reference numerals may be used in different figures to denote similar components.

DESCRIPTION OF EXAMPLE EMBODIMENTS

In examples disclosed herein, methods and devices are described that provide rate adaptive forward error correction using a flexible irregular error-correcting code, such as a staircase code. In some embodiments, each codeword of the ECC uses one of two or more different encodings, each encoding having a different number of parity bits. By adjusting the proportions of codewords of each encoding included in a data block, the FEC overhead can be finely adjusted in some examples, achieving flexible levels of FEC overhead in response to increased or decreased noise or perturbations in a communication channel.

Example Optical Communication System

Figure 1:
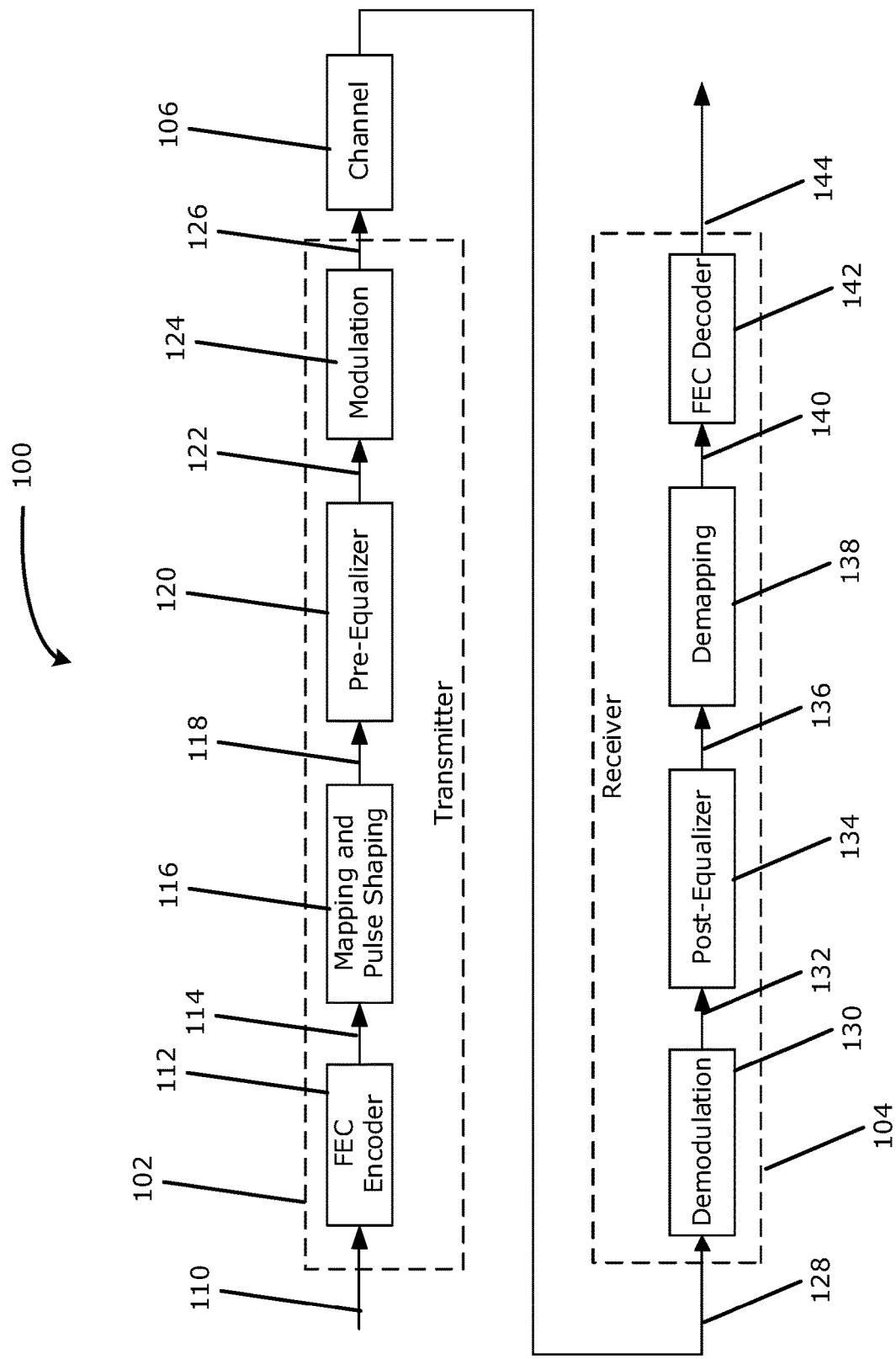
FIG. 1 is a block diagram of an optical communication system showing an example of an environment in which example embodiments of the present disclosure may operate.

FIG. 1 shows a simplified block diagram of an optical communication system 100 using FEC. Example embodiments will be described with reference to this example optical system 100, as part of an optical transmitter 102 (also referred to simply as transmitter 102) and/or optical receiver 104 also called simply receiver 104). It will be appreciated that the present disclosure is not limited to photonic or optical communication but may also be used for FEC in an electrical, radio-frequency, or other wired or wireless digital communication system, and that the use of the terms "transmitter" or "receiver" may refer to any type of transmitter or receiver using FEC.

The transmitter 102 transmits data through an optical channel 106 such as a fiber-optic channel, and the receiver 104 receives the data after it has passed through the optical channel 106. By using FEC, a very low error probability can be achieved, e.g., a bit error rate (BER) of below 1e-15 in some implementations.

At the transmitter 102, a digital data signal comprising a plurality of data bits 110 (i.e. information bits) goes through FEC encoder 112 to generate encoded bits in the form of a FEC enabled data signal 114. The FEC enabled data signal 114 may be a staircase code or other ECC in some embodiments, as described in greater detail below with reference to FIG. 2. The operation of the FEC encoder 112 in some embodiments is described in greater detail below with reference to FIG. 4.

The total number of encoded bits (Lc) of the FEC enabled data signal 114 is typically greater than the total number of data bits (Li). The quantity (Lc−Li)/Li is called the overhead (OH) of the FEC, while the quantity r=Li/Lc is called the code rate of the FEC. The FEC enabled data signal 114 is received by a mapping and pulse shaping module 116, which applies mapping to translate the encoded bits of the FEC enabled data signal 114 to discrete constellation points, according to some constellation label design, then converts the constellation points to digital pulses according to some pre-defined pulse-shaping function, thereby generating a digital electrical signal 118. A pre-equalizer 120 is optionally used on the transmitter side to compensate for some of the channel distortions, thereby generating an equalized digital electrical signal 122 from the digital electrical signal 118, which is modulated into an analog optical signal 126 by a modulation module 124.

At the receiver 104, the received analog optical signal 128 received over the optical channel 106, demodulated to a digital electrical signal 132 by a demodulation module 130, and equalized to generate an equalized digital electrical signal 136 by a post-equalizer 134, which compensates for the most of the remaining channel distortions. However, the post-equalizer cannot generally compensate for noise introduced by the optical channel 106. A demapping module 138 then translates the equalized digital electrical signal 136 back to a bit sequence, which is equivalent to the encoded bits from the transmitter with errors introduced from the optical channel 106. This bit sequence may be referred to in some examples as a FEC enabled received signal 140. A FEC decoder 142 is used to correct most of the errors of the FEC enabled received signal 140 and produce recovered information bits, which may be referred to in some examples as an error-corrected digital signal 144. The probability for a recovered information bit of the error-corrected digital signal 144 to be erroneous is designed to be lower than 1e-15 in some embodiments. The operation of the FEC decoder 142 in some embodiments is described in greater detail below with reference to FIG. 5.

Example Irregular Staircase Code

Different FEC encoding and decoding schemes, or ECCs, may be used in various embodiments. In some embodiments, the ECC is a staircase code. In some embodiments, the ECC is a non-staircase zipper code. In some embodiments, the ECC is an oFEC code. Example embodiments will be described in the context of a staircase code with reference to FIGS. 2-6, and non-staircase alternatives will then be described with reference to FIGS. 7A, 7B, and 8.

One family of widely used ECCs in optical systems is the family of spatially-coupled product-like codes with Bose-Chaudhuri-Hocquenghem (BCH) component codes (also called BCH codes or BCH encodings), as described by A. Y. Sukmadji, U. Martínez-Peñas and F. R. Kschischang, "Zipper Codes: Spatially-Coupled Product-Like Codes with Iterative Algebraic Decoding", 201916th Canadian Workshop on Information Theory (CWIT), Hamilton, ON, Canada, 2019, pp. 1-6, (hereinafter "Sukmadji") which is hereby incorporated by reference in its entirety. In this family of codes, each bit is protected by two BCH component codewords. Some examples include product codes, staircase codes, oFEC codes, and zipper codes. Product codes are described in greater detail by P. Elias, "Error-free coding", IEEE Trans. Inf. Theory, vol. 4, no. 4, pp. 29-37, September 1954, which is hereby incorporated by reference in its entirety, and are briefly described immediately below. Staircase codes are described in greater detail by B. Smith, A. Farhood, A. Hunt, F. Kschischang, and J. Lodge, "Staircase Codes: FEC for 100 Gb/s OTN", J. Lightwave Technol. 30, 110-117, 2012, which is hereby incorporated by reference in its entirety, and are briefly described below with reference to FIG. 2. oFEC is described in detail by Point-to-Point Coherent Optics Physical Layer 2.0 Specification P2PCO-SP-PHYv2.0-I01-190311, which is hereby incorporated by reference in its entirety, and described briefly below in reference to FIG. 8. Zipper codes are described in greater detail by Sukmadji, supra, and are briefly described below with reference to FIGS. 7A-7B.

BCH codes form a class of cyclic error-correcting codes that are constructed using polynomials over a finite field (also called a Galois field). One of the key features of BCH codes is that during code design, there is a precise control over the number of symbol errors correctable by the code. In particular, it is possible to design binary BCH codes that can correct multiple bit errors. Another potential advantage of BCH codes is the ease with which they can be decoded, namely, via an algebraic method known as syndrome decoding. This may simplify the design of a FEC decoder 142 using BCH codes, allowing it to use small low-power electronic hardware.

Thus, there are simple algebraic ways to solve for the error locations in 1-, 2-, or 3-error-correction BCH codes (called BCH1, BCH2, and BCH3 respectively, with a 1-error-correcting BCH1 code also being known as a Hamming code). Many spatially-coupled product-like ECCs employed in optical systems use BCH codes which can correct 3 errors or fewer (i.e. BCH1, BCH2, or BCH3), to benefit from the low complexity of the FEC decoder design.

Product codes organize bits into rectangular arrays, or data blocks, consisting of a number of rows and a number of columns. In a product code, each bit is part of both a "row codeword" and a "column codeword". Thus, each row contains a number of parity bits at one end, and each column contains a number of parity bits at one end, creating a vertical parity edge (e.g., visualized as a right edge of the rectangle) and a horizontal parity edge (e.g., visualized as the bottom edge of the rectangle) of a fixed number of parity bits. The corner where the parity bits of the two parity edges overlap (e.g., visualized as the bottom right corner of the rectangle) is effectively a "parity on parity" area, consisting of parity bits used to perform error checking on codewords consisting entirely of parity bits. This parity on parity area represents wasted bits that cannot be eliminated through puncturing without reducing the performance of a product code. Thus, there is a need to reduce the size of the parity on parity area in each data block to increase efficiency and throughput.

Whereas a conventional product code uses a single type of component code throughout, there have also been proposals for designing irregular product codes, wherein the rows of the data block have a varying number of parity bits. The number of parity bits starts at a relatively high number at a first end of each of the two parity edges, and tapers down to zero or relatively few parity bits as the parity edges approach the corner where they would ordinarily overlap. Some irregular product code designs may provide more fixed overhead options and better performance relative to conventional product codes. However, they do not provide flexible (used herein to mean dynamically reconfigurable or tunable) overhead levels, and they also have the consequence of offering uneven bit protection levels (i.e., if the parity edges are the right and bottom edges, the bits located in the bottom right corner experience the weakest protection level, whereas bits located in the top left corner experience the strongest protection level).

Product codes are block codes that are encoded and decoded one data block at a time independently of other data blocks in a data block sequence. In contrast, staircase codes exhibit a convolutional structure, which never terminates. A staircase code can be visualized as a sequence of rectangular data blocks stacked in a staircase-like structure, with a second data block positioned to the right of an initial data block, a third data block positioned above the second data block, a fourth data block to the left of the third data block, and so on. Each row and column of the "staircase" forms a codeword: thus, each row of the initial data block is concatenated to the corresponding row of the second data block to form a single row-wise codeword, whereas each column of the second data block is concatenated with the corresponding column of the third data block to form a single column-wise codeword, and so on. In this example, the second data block may be referred to as a "row-wise" data block, whereas the third data block may be referred to as a "column-wise" data block. Typically, a row-wise data block includes an edge of parity bits at its edge distal from the prior data block (i.e. the right edge of the second data block in this example), and a column-wise data block includes an edge of parity bits at its edge distal from the prior data block (i.e. the top edge of the third data block in this example). Due to the convolutional structure of a staircase code, an iterative sliding window decoding can be employed, in which the prior sub-blocks can help the current block detect and correct errors. As a result, staircase codes usually have higher input BER thresholds relative to product codes, given the same overhead.

The present disclosure describes embodiments in which a single decoder structure may be used to decode codewords with different overhead levels. The decoder in some embodiments has low design and implementation complexity, allows the overhead level to be finely tuned and dynamically reconfigured, and achieves performance on par with or superior to existing approaches. One or more advantages relative to shortening, including low hardware design complexity, low implementation complexity, high tenability, and/or better performance, may be achieved in some embodiments using spatially-coupled product-like codes with irregular BCH component codes (1-, 2-, or 3-error correcting BCH), without increasing algorithmic design complexity. The three types of codewords (BCH1, BCH2, and BCH3) can all be decoded in some embodiments by a gated version of a BCH3 decoder, resulting in low design and decoding complexity. In some embodiments, the proportions of the three BCH codes can be adjusted based on the target overhead level, achieving high tenability. The performance of some embodiments may exceed shortening.

A first example base code structure for the flexible irregular ECC, namely a flexible irregular staircase code, is now described in detail with reference to FIG. 2.

Figure 2:
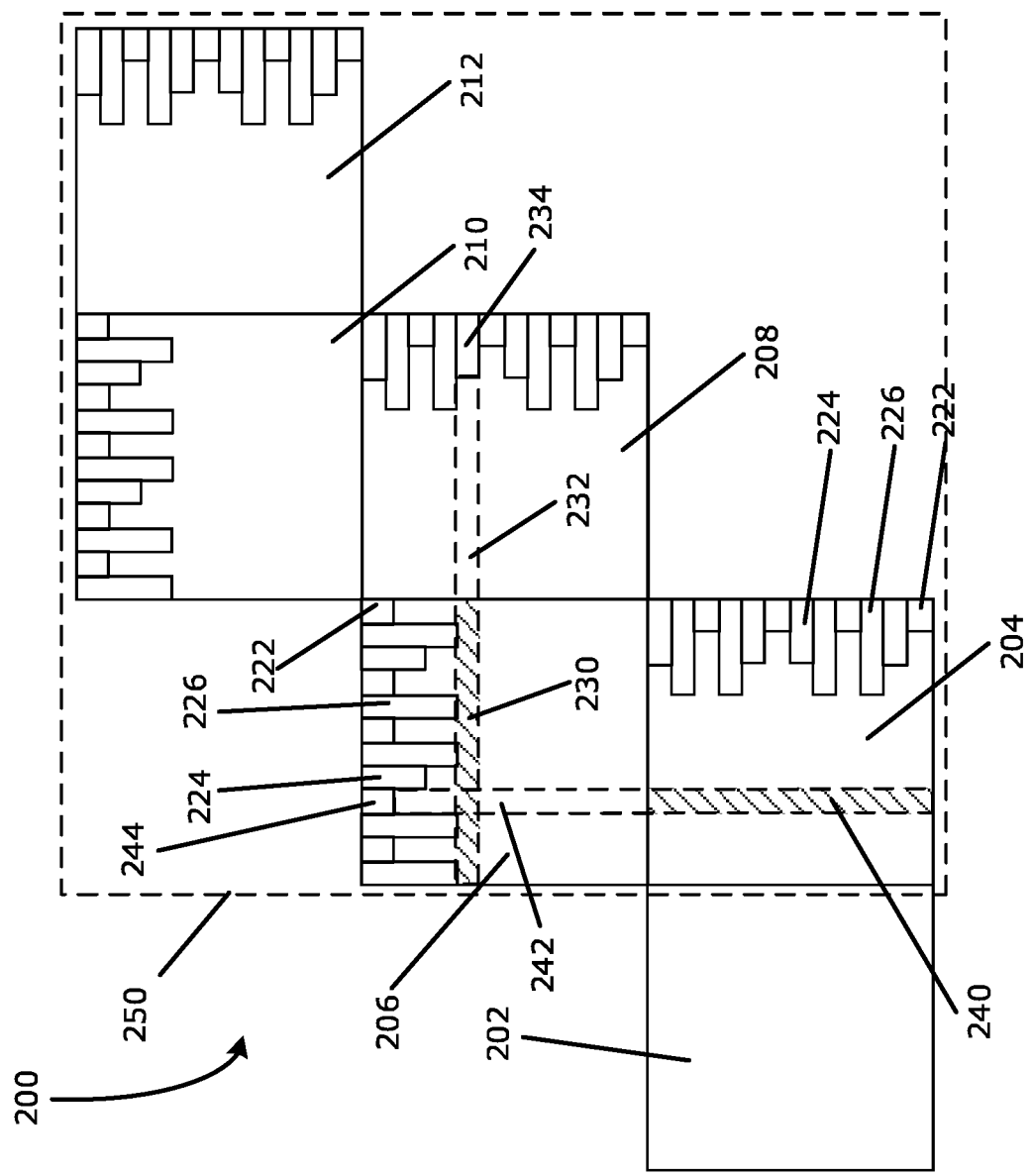
FIG. 2 is a schematic diagram of a flexible irregular staircase code used for forward error correction, in accordance with examples described herein.

FIG. 2 shows a schematic diagram of a flexible irregular staircase code used for forward error correction in accordance with some embodiments described herein. The irregular staircase code 200 is a sequence of data blocks, including, in sequence, an initial data block 202, a first row-wise data block 204, a first column-wise data block 206, a second row-wise data block 208, a second column-wise data block 210, and a third row-wise data block 212. Thus, the initial data block 202 would be encoded and transmitted prior to the first row-wise data block 204 and would constitute a "prior" data block relative to the first row-wise data block 204. The transmitter's FEC encoder 112 receives the digital data signal 110 and encodes it into the irregular staircase code 200 as the sequence of data blocks, alternating between row-wise data blocks and column-wise data blocks. Similarly, the receiver's FEC decoder 142 receives the FEC enabled received signal 140 and decodes it into the sequence of data blocks making up the irregular staircase code 200.

Each row-wise data block 204, 208, 212 comprises a plurality of rows. Each row comprises a data bit sequence (e.g., data bit sequence 232 of first row-wise data block 204) comprising one or more of the data bits, and a parity bit sequence (e.g., parity bit sequence 234 of second row-wise data block 204), comprising one or more parity bits. Collectively, the plurality of rows of a row-wise data block define a plurality of columns, such that a given bit is located in one row and one column. The parity bit sequence of each row-wise codeword (e.g., parity bit sequence 234 of second row-wise data block 208) is encoded based on its respective data bit sequence (e.g., data bit sequence 232 of second row-wise data block 208) and a corresponding row of a prior column-wise data block (e.g., row 230 of first column-wise data block 206).

Similarly, each column-wise data block 206, 210 comprises a plurality of columns. Each column comprises a data bit sequence (e.g., data bit sequence 242 of first column-wise data block 206) comprising one or more of the data bits, and a parity bit sequence (e.g., parity bit sequence 244 of first column-wise data block 206), comprising one or more parity bits. Collectively, the plurality of columns of a column-wise data block define a plurality of rows, such that a given bit is located in one row and one column. The parity bit sequence of each column-wise codeword (e.g., parity bit sequence 244 of first column-wise data block 206) is encoded based on its respective data bit sequence (e.g., data bit sequence 242 of first column-wise data block 206) and a corresponding column of a prior row-wise data block (e.g., column 240 of first row-wise data block 204).

As seen in FIG. 2, the only exception to this pattern is the initial data block 202, which may in some embodiments be encoded and decoded at the start of a communication. In some embodiments, the initial data block 202 may contain no parity bits. In other embodiments, the initial data block 202 may contain only bit values known to the transmitter 102 and receiver 104, such as a data block of entirely zero bit values, thus eliminating the need to transmit the initial data block 202—i.e., the entire initial data block 202 may be eliminated from the signal through a process equivalent to shortening. The rows or columns of the initial data block 202 may be used as part of the row-wise or column-wise codewords of a subsequent data block (e.g. first row-wise data block 204).

In some embodiments, decoding of the staircase code 200 may take place within a sliding window 250 encompassing multiple data blocks (shown as five data blocks in FIG. 2). The sliding window is described in greater detail below with reference to FIG. 5.

It will be appreciated that the rows, columns, and data and parity bit sequences shown in FIG. 2 are simplified for illustrative purposes and are not shown to scale. In some embodiments, each data block may have tens, hundreds, or thousands of rows and columns, and the parity bit sequence may comprise a small fraction of the length of a given codeword.

Each codeword thus contains a parity bit sequence. However, the example staircase code 200 is "irregular" insofar as its individual codewords may use different encodings having a different number of parity bits. In the example irregular staircase code 200, each data block contains at least one parity bits sequence of a first encoding 222, such as BCH1, consisting of a first predetermined number of parity bits; at least one parity bits sequence of a second encoding 224, such as BCH2, consisting of a second predetermined number of parity bits greater than the first predetermined number; and at least one parity bits sequence of a third encoding 226, such as BCH3, consisting of a third predetermined number of parity bits greater than the second predetermined number. It will be appreciated that some examples may only use two encodings, or may use more than three encodings. For example, an alternative embodiment may use only a first encoding 222 and a second encoding 224. Furthermore, the two encodings used in other embodiments could be, e.g., BCH1 for the first encoding 222 and BCH3 for the second encoding 224, or BCH2 for the first encoding 222 and BCH3 for the second encoding 224.

The allocation or distribution of codewords using each encoding may be determined in some embodiments with reference to a target error correction overhead level. A higher desired level of error correction (i.e. higher overhead) may dictate a larger proportion BCH3 codewords (i.e. codewords having parity bit sequences of the third encoding 226) relative to BCH2 and BCH1 codewords, whereas a lower desired level of error correction (i.e. lower overhead) may dictate a larger proportion BCH1 codewords (i.e. codewords having parity bit sequences of the first encoding 222) relative to BCH2 and BCH3 codewords. Thus, each data block of the sequence of data blocks may be encoded to include a first number of parity bit sequences of the first encoding, a second number of parity bit sequences of the second encoding, and a third number of parity bit sequences of the third encoding, wherein the first number, second number, and third number are determined based on the target error correction overhead level.

In some embodiments, the target error correction overhead level may be determined dynamically based on channel conditions or other operating parameters. For example, the receiver 104 in some embodiments may be configured to provide feedback to the transmitter 102 to indicate the SNR of the received signal or other information indicative of environmental conditions or channel conditions. The receiver 104 and/or transmitter 102 may also communicate further to optimization of the target error correction overhead level based on the nature of the data being transmitted, the operating mode of the receiver 104, or any other factor that might require tuning of the FEC overhead level. This communication could take place at power-up, at the beginning of a communication, or periodically during a communication to dynamically adapt the FEC overhead level to changing conditions or requirements. The transmitter 102 and/or receiver 104 may in some embodiments be a transceiver or modem configured to both transmit and receive data over the optical channel 106 or through some other channel or medium, thereby enabling communication of information from the receiver 104 to the transmitter 102. In some embodiments, channel conditions may be assessed (e.g., by the receiver 104 based on the BER of the received optical signal 128) and used to dynamically change the distribution of codeword encodings of the ECC. The receiver 104 or transmitter 102 may then determine a new target error correction overhead level based on the assessed channel conditions. In some embodiments, the receiver 104 may transmit channel condition information to the transmitter 102 indicating the assessed channel conditions. The transmitter 102 may then update the target error correction overhead level based on the received channel condition information. The first number, second number, and third number, and therefore the distribution of codeword encodings within each data block of the ECC, may be changed based on the updated target error correction overhead level. The FEC encoder 112 will then encode the changed ECC. The new ECC codeword encoding distribution will be made known to the receiver 104 (e.g., either transmitted directly from the transmitter 102 or generated at the receiver 104 based on a predetermined algorithm using the channel condition data generated by the receiver 104), and the FEC decoder 142 will thereafter use the new ECC codeword encoding to decode the received ECC.

The distribution of codewords of each encoding within a given data block may be configured by the FEC encoder 112 of the transmitter 102. The FEC encoder 112 may distribute the codewords to achieve a homogeneous or evenly-distributed distribution of codewords of different encodings among the rows or columns of a data block, to avoid clustering of multiple codewords of the first encoding 222 or multiple codewords of the third encoding 226 in adjacent rows or columns. In some embodiments, the parity bit sequences of each encoding are distributed among the rows or columns of a given data block such that a number of adjacent parity bit sequences of the same encoding is minimized.

In some embodiments, the data blocks have different distributions of codeword encodings from each other, while in other embodiments the data blocks all have the same distribution of codeword encodings. In still other embodiments, such as the example staircase code 200 in FIG. 2, all row-wise data blocks have the same distribution of codeword encodings and all column-wise data blocks have the same distribution of codeword encodings. Typically, using a single distribution for all data blocks, or two distributions (one row-wise, one column-wise), facilitates coordination of the encoding and decoding between the transmitter 102 and receiver 104, as the data signal does not need to include additional metadata indicating the distribution for each transmitted data block. In some embodiments, however, the distribution could be automatically generated for each data block based on a seed value or the target error correction overhead level, allowing the transmitter 102 and receiver 104 to know the distribution for each data block without exchanging any metadata other than the current target error correction overhead level. The distribution patterns may be predefined, in which case they may be stored, or they may be regenerated based on a set of parameters. Each of the patterns (i.e. distributions of codeword encodings) may be assigned an index in some embodiments: this allows the transmitter and receiver to communicate only this index at startup to coordinate the distribution of codeword encodings. Metadata regarding distributions of codeword encodings in each data block may be coordinated between the transmitter 102 and receiver 104 using the mechanisms described above for exchanging information regarding the target error correction overhead level.

Encoding of the flexible, irregular ECC, such as the irregular staircase code 200, may be performed by a FEC encoder 112 and is described in detail below with reference to FIG. 4. Decoding the ECC to perform error detection and error correction may be carried out by a FEC decoder 142 and is described in detail below with reference to FIG. 5. An example architecture for a FEC decoder 142 will now be described with reference to FIG. 3.

Example FEC Decoder

Figure 3:
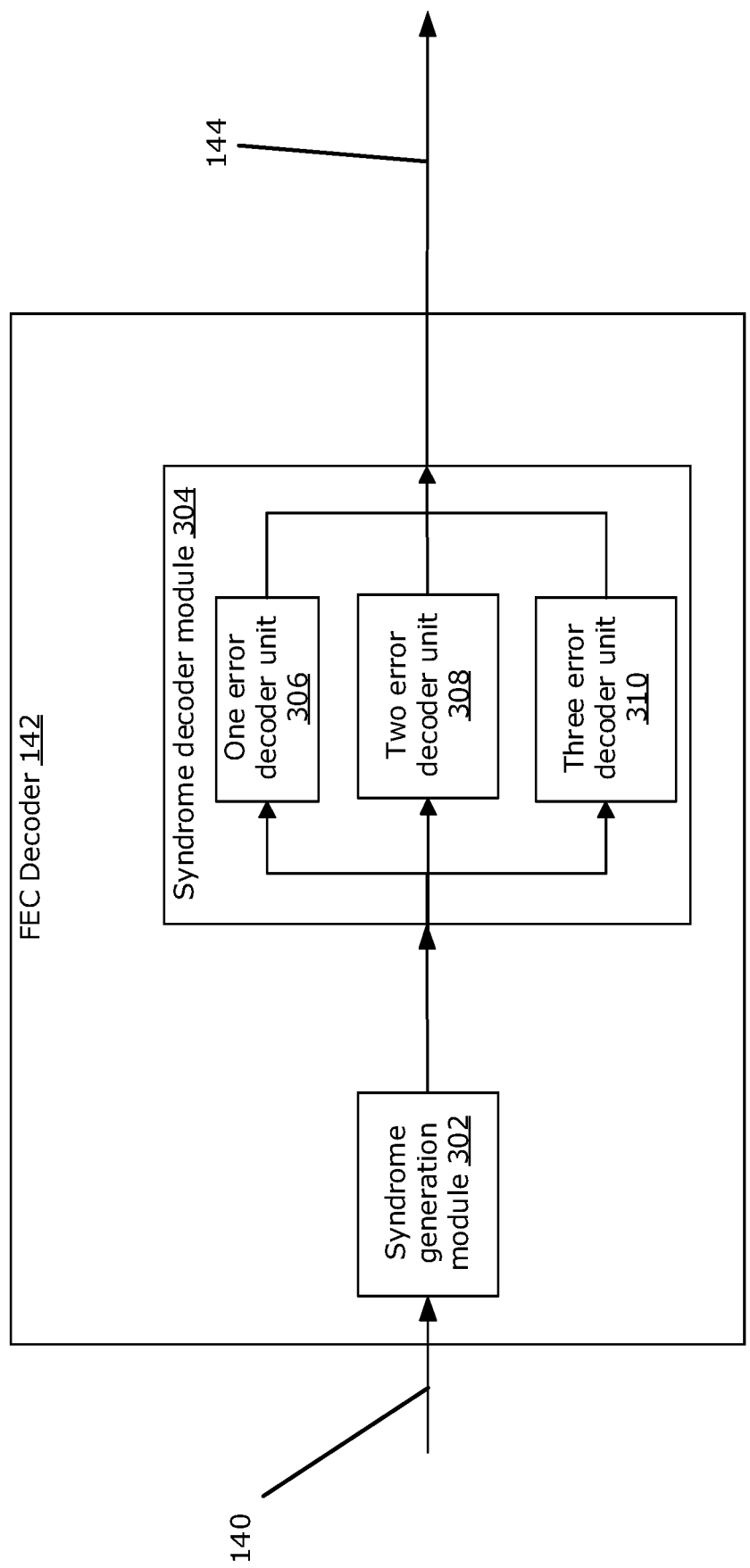
FIG. 3 is a block diagram of an example FEC decoder usable in the example optical receiver of FIG. 1, in accordance with examples described herein.

FIG. 3 shows an example FEC decoder 142 used to decode an irregular ECC having three different codeword encodings configured to correct up to one, two, or three bit errors per codeword, respectively. The detailed operation of the FEC decoder 142 is described below with reference to FIG. 5.

The FEC decoder 142 receives the FEC enabled received signal 140 consisting of the encoded bits and errors, e.g. irregular staircase code 200 containing bit errors due to transmission over the optical channel 106. Each two adjacent data blocks of the received FEC enabled received signal 140 are used to identify row-wise or column-wise bit sequences to determine if they constitute codewords (i.e., no bit errors). Each row or column is processed independently until a bit error is detected.

A syndrome generation module 302 is used to generate or calculate a syndrome vector based on the bit values of the current row or column being processed. For a row of a received row-wise data block, the syndrome generation module 302 performs a parity check using a parity bit sequence of the row to detect any bit errors in a data bit sequence of the row or in a corresponding row of a prior column-wise data block based on one or more elements of the calculated syndrome. The corresponding operation is carried out on each column of a column-wise data block.

The resulting syndrome vector is passed to a syndrome decoder module 304, which includes three error decoder units: a one error decoder unit 306 capable of detecting and correcting up to one bit error, a two error decoder unit 308 capable of detecting and correcting up to two bit errors, and a three error decoder unit 310 capable of detecting and correcting up to three bit errors. In some embodiments, the one error decoder unit 306 can be used to correct errors in BCH1 codewords, the two error decoder unit 308 can be used to correct errors in BCH2 codewords, and the three error decoder unit 310 can be used to correct errors in BCH3 codewords. Furthermore, when a single bit error is detected in a BCH2 or BCH3 codeword, the one error decoder unit 306 can be used to correct it, and when two errors are detected in a BCH3 codeword, the two error decoder unit 308 can be used to correct it. The syndrome decoder module 304 thus operates as a gated decoder, combining some of the advantages of multiple parallel FEC decoders described above with flexibility and tunability. In alternate embodiments, the syndrome decoder module 304 may contain only two or more than three error decoder units configured to correct a different number of bit errors.

Once the bit errors have been corrected, the FEC decoder 142 outputs the error-corrected digital signal 144.

Example Encoding Method

An example method 400 for encoding irregular staircase code 200 is now described with reference to FIG. 4. As a staircase code constitutes a special case of a zipper code (described below with reference to FIGS. 7A-7B), it will be appreciated that the described method 400 could be generalized to non-staircase zipper codes, such as oFEC codes (described below with reference to FIG. 8), based on the particular details of how such codes are encoded.

Figure 4:
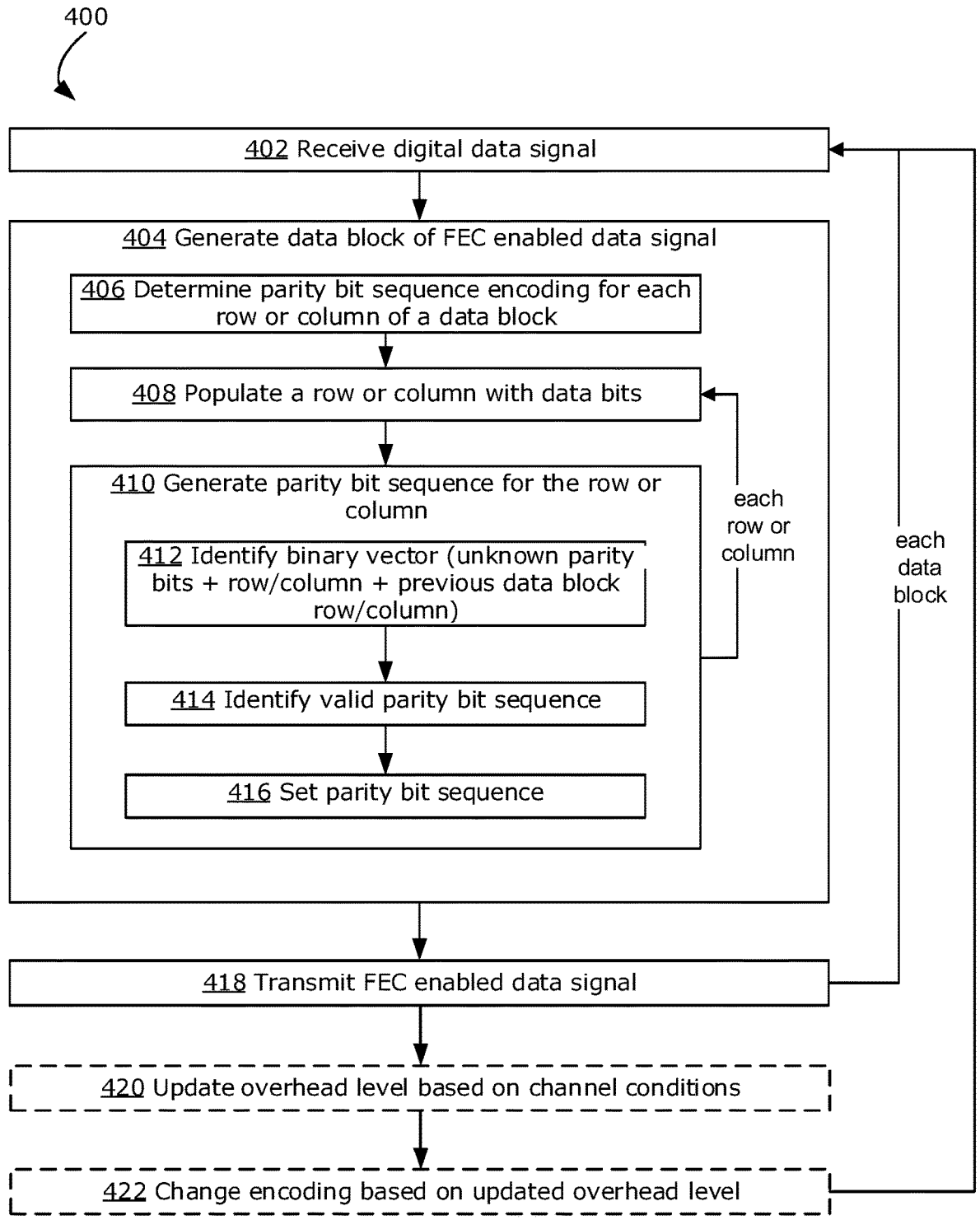
FIG. 4 is a flowchart of an example method for encoding the staircase code of FIG. 2, in accordance with examples described herein.

FIG. 4 shows a flowchart of an example method 400 for encoding the irregular staircase code 200. The method 400 may in some embodiments be performed by a FEC encoder 112 of a transmitter, such as an optical transmitter 102. The method 400 repeats steps 402, 404, and 418 for each received data block of a received digital data signal 110. Similarly, the method 400 repeats sub-steps 406, 408, and 410 of step 404 for each row or column of the current data block. Optional steps 420 and 422 are shown in dashed lines.

As described above with reference to FIG. 2, the encoding of the initial data block 202 may not adhere to the pattern of encoding steps shown in the flowchart of FIG. 4, as the initial data block 202 may not include parity bits in some embodiments. Thus, in some embodiments, the initial data block 202 may in some embodiments be populated entirely with data bits of the received digital data signal 110, or in other embodiments with non-information-bearing fixed bit values (e.g., all zero bit values). However, method 400 describes the encoding of each subsequent row-wise and column-wise data block of the irregular staircase code 200.

At 402, the FEC encoder 112 receives the digital data signal 110. This steps is repeated for each set of data bits received that are sufficient to populate a data block of the staircase code 200. It will be appreciated that the steps of method 400 are presented as a linear sequence, but in some embodiments may occur in parallel or otherwise in a different order or concurrently. For example, the process of generating data blocks from the received data bits of the digital data signal 110 may occur continuously while the data blocks are being encoded and transmitted.

At 404, the FEC encoder 112 generates a data block of the FEC enabled data signal 114, i.e. a row-wise of column-wise data block of the irregular staircase code 200. Step 404 is made up of sub-steps 406, 408, and 410.

At sub-step 406, the FEC encoder 112 determines a parity bit sequence encoding for each row or column of a data block. Thus, for a row-wise data block, each row is assigned an encoding from the first encoding 222 (e.g. BCH1), second encoding 224 (e.g. BCH2), or third encoding 226 (e.g. BCH3) (for embodiments using three encodings). This assignment may be based on the distribution of codeword encodings, as described above with reference to FIG. 2.

For each row or column of the current data block, steps 408 and 410 are performed. At 408, a row (for row-wise data blocks) or column (for column-wise data blocks) of the data block is populated with data bits from the received digital data signal 110.

At 410, a parity bit sequence is generated for the row or column. Step 410 is performed as sub-steps 412, 414, and 416.

At 412, a binary vector is identified. The binary vector consists of the as-yet-unknown parity bits (e.g., parity bit sequence 234), concatenated to the data bits of the row or column of the current data block (e.g., data bit sequence 232), and to the bits of the corresponding row or column of the prior data block (e.g., row 230). Thus, once the parity bits of the binary vector are determined, the binary vector will be a codeword of the staircase code 200.

At 414, a valid parity bit sequence is identified. This determination is made based on the encoding used for the codeword. For example, if the parity bit sequence 234 uses a BCH encoding, then identifying a valid parity bit sequence may be accomplished using a parity check matrix defined by numbers of a Galois field. BCH codeword encoding will now be described in detail.

Let t be the binary vector. An (n, k) BCH encoder, over Galois field (GF) of size $2^m$, utilizes a generator matrix G to generate the codeword x:

$$x = tG,$$

wherein t is a 1 by k binary vector, x is a 1 by n binary vector, and G is a k by n binary matrix.

The parity matrices for BCH1, BCH2, and BCH3 ($H_1$, $H_2$, and $H_3$, respectively) are all n columns wide (n being the length of a codeword) and can be written in GF element format (as opposed to binary format) as follows, assuming use of the same Galois field for (GF) each encoding, wherein a is the primitive element of the Galois field:

$$H_1 = [1 \quad \alpha \quad \alpha^2 \quad ...]$$

$$H_2 = \begin{bmatrix} 1 & \alpha & \alpha^2 & ... \\ 1 & \alpha^3 & \alpha^6 & ... \end{bmatrix}$$

$$H_3 = \begin{bmatrix} 1 & \alpha & \alpha^2 & ... \\ 1 & \alpha^3 & \alpha^6 & ... \\ 1 & \alpha^5 & \alpha^{10} & ... \end{bmatrix}$$

Thus, for parity bit sequences of the first encoding 222, wherein the first encoding is BCH1, the parity check matrix comprises a one row matrix defined by a primitive element a of a Galois field such that the first element of the parity check matrix is one, and each subsequent element of the parity check matrix is a times the previous element. For parity bit sequences of the second encoding 224, wherein the second encoding is BCH2, the parity check matrix comprises a two row matrix defined by a primitive element a of a Galois field such that the first element of the first row of the parity check matrix is one, each subsequent element of the first row of the parity check matrix is a times the previous element, the first element of the second row of the parity check matrix is one, and each subsequent element of the second row of the parity check matrix is $a^3$ times the previous element. For parity bit sequences of the third encoding 226, wherein the third encoding is BCH3, the parity check matrix comprises a three row matrix defined by a primitive element a of a Galois field such that the first element of the first row of the parity check matrix is one, each subsequent element of the first row of the parity check matrix is a times the previous element, the first element of the second row of the parity check matrix is one, each subsequent element of the second row of the parity check matrix is $a^3$ times the previous element, the first element of the third row of the parity check matrix is one, and each subsequent element of the third row of the parity check matrix is $a^5$ times the previous element.

The binary vector (in numeric format) is multiplied by the transpose of the parity check matrix to generate a syndrome, the syndrome comprising a vector having a number of elements equal to a number of rows of the parity check matrix (in GF or numeric format, not binary format). The syndrome is defined for BCH1 as $S_1$, for BCH2 as $[S_1, S_3]$, and for BCH3 as $[S_1, S_3, S_5]$ wherein $S_1 = cH_1^T$, $[S_1, S_3] = cH_2^T$, $[S_1, S_3, S_5] = cH_3^T$, and wherein c is the binary vector in numeric format, $H_1^T$ is the transpose of the parity check matrix $H_1$, $H_2^T$ is the transpose of the parity check matrix $H_2$, and $H_3^T$ is the transpose of the parity check matrix $H_3$. BCH1 encoding and decoding uses $S_1$ only, BCH2 decoding uses $S_1$ and $S_3$ only, and BCH3 decoding uses $S_1$, $S_3$, and $S_5$.

Values must be identified for the unknown parity bits such that the calculated syndrome must have all of its elements (e.g., $S_1$ and $S_3$ for BCH2) equal to zero. Identifying a valid parity bit sequence for such an encoding may be performed a number of different ways in different embodiments. Some embodiments perform this identification by solving for the unknown parity bits, e.g., by performing the multiplication by the parity check matrix using a binary vector with unknown bit values and then solving the resulting equation for the unknown parity bit values. It will be appreciated that solving such mathematical calculations or constraints may be performed by electronic hardware and/or software in various ways.

At 416, the parity bit sequence is set to be equal to a valid parity bit sequence, e.g. based on the solved constraints or equations described above, such that the binary vector (including the valid parity bits) multiplied by the transpose of the parity check matrix generates a syndrome vector wherein each element is equal to zero. This operation is equivalent to multiplying binary vector t by generator matrix G to generate codeword x, as described above.

At 418, the FEC enabled data signal 114 is transmitted. In some embodiments, this may mean propagating the FEC enabled data signal 114 through the other modules 116, 120, and 124 of the optical transmitter 102 to transmit the resulting optical signal 126 across the optical channel 106 using the modulation module 124. In some embodiments, the FEC enabled data signal 114 is propagated and transmitted as the initial data block 202, followed by each subsequent data block in sequence: 204, 206, 208, 210, 212, etc.

In some embodiments, the encoding of the irregular staircase code 200 may be dynamically adapted to channel conditions. As described above, channel conditions may be assessed and used to dynamically change the distribution of codeword encodings of the irregular staircase code 200 or other flexible ECC.

At 420, optionally, a new target error correction overhead level may be determined (e.g. by the FEC encoder 142) based on the assessed channel conditions as a result of receiving channel condition information (e.g., sent by the receiver 104 based on BER or other distortions detected in the received optical signal 128).

At 422, optionally, the first number, second number, and third number, and therefore the distribution of codeword encodings within each data block of the irregular staircase code 200 or other flexible ECC, may be changed based on the updated target error correction overhead level. The FEC encoder 112 will then return to step 402 to encode the next data block using the changed ECC encoding.

Example Decoding Method

An example method 500 for decoding irregular staircase code 200 to detect and correct bit errors is now described with reference to FIG. 5. As a staircase code constitutes a special case of a zipper code (described below with reference to FIGS. 7A-7B), it will be appreciated that the described method 500 could be generalized to non-staircase zipper codes, such as oFEC codes (described below with reference to FIG. 8), based on the particular details of how such codes are decoded.

Figure 5:
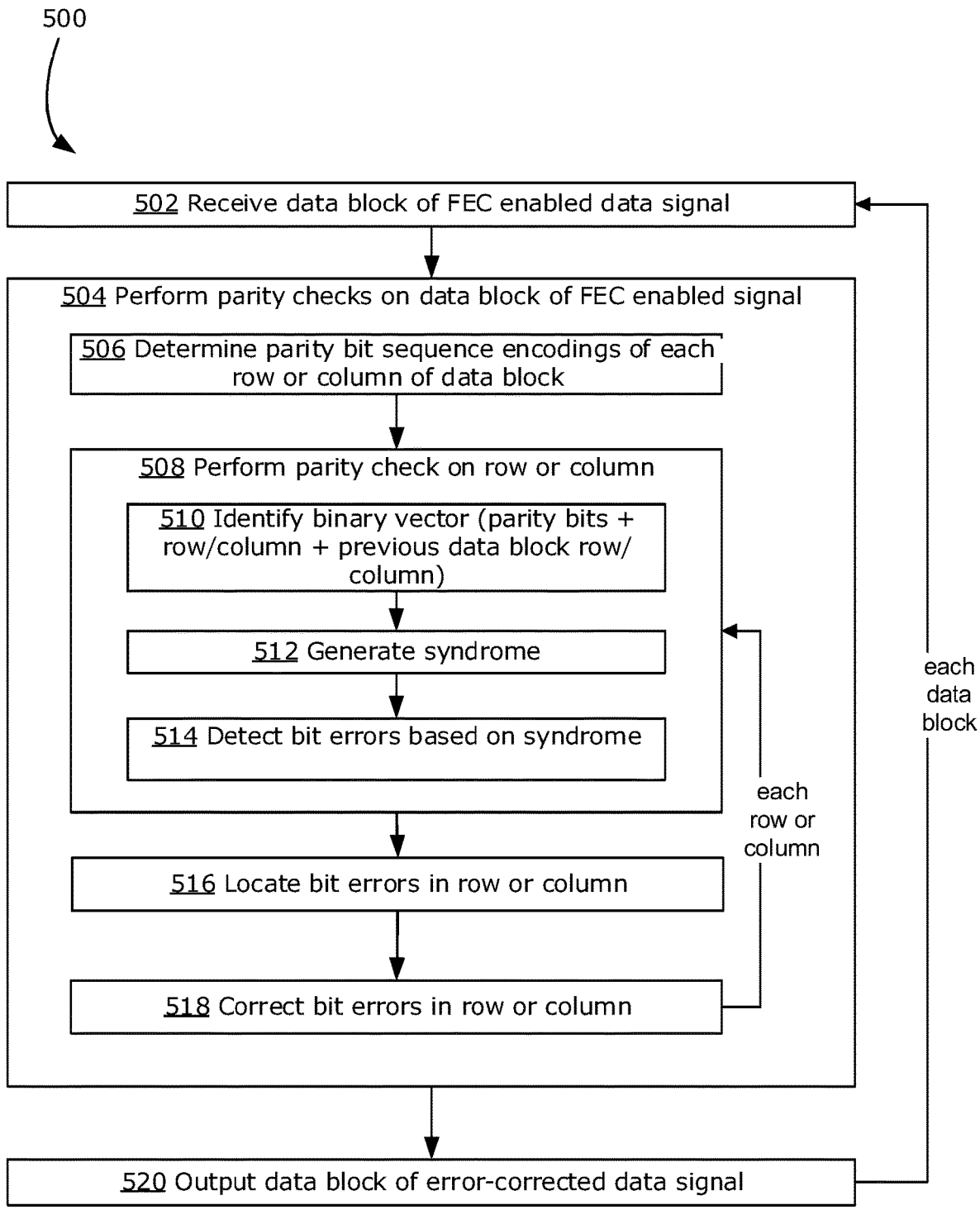
FIG. 5 is a flowchart of an example method for decoding the staircase code of FIG. 2 to detect and correct bit errors in a received signal, in accordance with examples described herein.

FIG. 5 shows a flowchart of an example method for decoding the irregular staircase code 200 of FIG. 2 to detect and correct bit errors in a received signal. The method 500 may in some embodiments be performed by a FEC decoder 142 of a receiver, such as an optical receiver 104. The method 500 repeats steps 502, 504, and 520 for each received data block of a received FEC enabled received signal 140. Similarly, the method 500 repeats sub-steps 506, 508, 516, and 518 of step 504 for each row or column of the current data block.

As described above with reference to FIG. 2 and FIG. 4, the decoding of the initial data block 202 may not adhere to the pattern of decoding steps shown in the flowchart of FIG. 5, as the initial data block 202 may not include parity bits in some embodiments, and may not include information-bearing bits of any kind in some embodiments. Thus, in some embodiments, the initial data block 202 may be populated entirely with data bits of the received digital data signal 110, or entirely with fixed non-information-baring bits (e.g., all zero bit values), and does not have parity checks performed on it. However, method 500 describes the decoding of each subsequent row-wise and column-wise data block of the irregular staircase code 200.

At 502, the FEC decoder 142 receives a data block of the FEC enabled received signal 140, for example from the demapping module 138.

At 504, the FEC decoder 142 performs parity checks on the data block of FEC enabled received signal 140. These parity checks are performed as sub-steps 506, 508, 516, and 518.

At 506, the FEC decoder 142 determines parity bit sequence encodings for each row or column of the data block. The distribution of codewords of each encoding within a given data block may be based on the distribution of codeword encodings described above with reference to FIG. 2. This information may, for example, be received from the transmitter 102 at startup.

Sub-steps 508, 516, and 518 are performed for each row or column of the current data block.

At 508, the FEC decoder 142 performs a parity check on the row or column. This parity check is performed as sub-steps 510, 512, and 514.

At 510, a binary vector is identified, as in method 400 of FIG. 4. The binary vector corresponds to a codeword (if valid, i.e. it contains no bit errors): it consists of the parity bits of the current row or column (e.g., parity bit sequence 234), the data bits of the current row or column (e.g., data bit sequence 232), and a row or column of a prior data block (e.g., row 230).

At 512, the syndrome generation module 302 is used to generate the syndrome, as described above with reference to method 400. The binary vector is multiplied by the transpose of the parity check matrix for the given encoding. Syndrome generation in decoding will now be described in detail.

Let y be the binary vector, which is equivalent to a BCH codeword plus some possible errors y=x⊕e, where ⊕ is the bit-wise exclusive or operator, and e is a 1 by n binary vector. The BCH decoder computes a syndrome vector s, by taking the product of y and the transpose $H^T$ of the parity check matrix H:

$$s=yH^T,$$

wherein y is a 1 by n vector, s is a 1 by (n-k) vector, and H is a (n-k) by n matrix.

At 514, the syndrome decoder module 304 detects bit errors based on the syndrome s. The binary vector y is a codeword if and only if s=0. When s≠0 and the Hamming weight of e is lower than or equal to the maximum number of errors the BCH code can correct, the vector s alone is the sufficient information needed to compute e. Once e is computed, x can be recovered by x=y⊕e.

As in method 400, define $S_1 = yH_1^T$, $[S_1, S_3] = yH_2^T$, and $[S_1, S_3, S_5] = yH_3^T$. BCH1 decoding requires $S_1$ only, BCH2 decoding requires $S_1$ and $S_3$, and BCH3 decoding requires $S_1$, $S_3$, and $S_5$. In some embodiments, a BCH3 decoder can be gated (such as gated FEC decoder 142 of FIG. 3) to perform bit error detection, location, and correction in BCH1, BCH2, and BCH3 codewords as described below.

A BCH3 decoder may detect and handle the cases of 0, 1, 2, or 3 errors separately, as set out in Table 1 below, wherein $D_3 = S_1^3 + S_3$ and $D_5 = S_1^5 + S_5$.

TABLE 1

BCH3 Decoder

| # of errors, v | $S_1$ | $S_3$ | $S_5$ | $D_3$ | $D_5$ | Operation |
|---|---|---|---|---|---|---|
| v = 0 | 0 | 0 | 0 | 0 | 0 | No error to correct |
| v = 1 | ≠0 | ≠0 | ≠0 | 0 | 0 | Pass $S_1$ to 1 error decoder |
| v = 2 | ≠0 | | | ≠0 | $S_1 D_5 = S_3 D_3$ | Pass $S_1$ and $S_3$ to 2 error decoder |
| v = 3 | | | | ≠0 | Either $S_1$ or $D_5$ column condition for row v = 2 not satisfied | 3 error decoder |

Whereas Table 1 defines operations to perform in response to different values of $S_1$, $S_3$, $S_5$, $D_3$, and $D_5$ for a BCH3 decoder, it will be appreciated that sub-tables of Table 1 represent the operations to perform by a BCH2 encoder (rows v=0 through v=2, with columns $S_5$ and $D_5$ eliminated) or a BCH1 encoder (rows v=0 and v=1, with columns $S_3$, $S_5$, $D_3$ and $D_5$ eliminated).

As $H_1$ and $H_2$ are sub-matrices of $H_3$ (as shown above with reference to FIG. 4), the BCH1 decoder and BCH2 decoder may be implemented as sub-modules of the BCH3 decoder. A flow chart of an example gated BCH3 decoder is described in detail below with reference to FIG. 6.

Thus, in response to determining that any element of the syndrome is not zero, the syndrome decoder module 304 may determine that the binary vector contains at least one bit error. In embodiments wherein the syndrome is always calculated using the BCH3 parity check matrix regardless of the encoding used for the current codeword, this determination may disregard the third element of the syndrome for BCH1 and BCH2, and may also disregard the second element of the syndrome for BCH1.

At 516, the syndrome decoder module 304 is used to locate bit errors in the binary vector. At 518, once the bit errors have been located, the syndrome decoder module 304 corrects the bit errors, e.g., by flipping the value of the bit where the bit error is located. At least step 516, and possibly step 518 in some embodiments, are performed by one of the error decoder units 306, 308, 310, in accordance with the operations identified in Table 1 above.

Thus, for BCH1, the syndrome decoder module 304 is configured to provide the first element of the syndrome to the one error decoder unit 306, use the one error decoder unit 306 to locate a single bit error in the binary vector based on the first element of the syndrome, and correct the single bit error.

For BCH2, the syndrome decoder module 304 is configured to calculate value $D_3$ by adding the cube of the first element of the syndrome to the second element of the syndrome. If $D_3$ is zero, the syndrome decoder module 304 is configured to provide the first element of the syndrome to the one error decoder unit 306, use the one error decoder unit 306 to locate a single bit error in the binary vector based on the first element of the syndrome, and correct the single bit error. If $D_3$ is not zero the syndrome decoder module 304 is configured to provide the first and second elements of the syndrome to the two error decoder unit 308, use the two error decoder unit 308 to locate two bit errors in the binary vector based on the first element of the syndrome, and correct the two bit errors.

For BCH3, the syndrome decoder module 304 is configured to calculate value $D_3$ by adding the cube of the first element of the syndrome to the second element of the syndrome. If $D_3$ is zero, the syndrome decoder module 304 is configured to provide the first element of the syndrome to the one error decoder unit 306, use the one error decoder unit 306 to locate a single bit error in the binary vector based on the first element of the syndrome, and correct the single bit error. If $D_3$ is not zero, the syndrome decoder module 304 is configured to calculate a value $D_5$ by adding the first element of the syndrome, raised to the fifth power, to the third element of the syndrome. If the first element of the syndrome, multiplied by $D_5$, is equal to the second element of the syndrome, multiplied by $D_3$, the syndrome decoder module 304 is configured to provide the first and second elements of the syndrome to the two error decoder unit 308, use the two error decoder unit 308 to locate two bit errors in the binary vector based on the first and second elements of the syndrome, and correct the two bit errors. If $D_3$ is not equal to zero, and either of two other conditions is satisfied, the syndrome decoder module 304 is configured to provide the first, second, and third elements of the syndrome to the three error decoder unit 310, use the three error decoder unit 310 to locate three bit errors in the binary vector based on the first, second, and third elements of the syndrome, and correct the three bit errors. The two other conditions are: first, that the first element of the syndrome, multiplied by $D_5$, is not equal to the second element of the syndrome, multiplied by $D_3$; and second, that $S_1$ is equal to zero.

In some embodiments, decoding of the staircase code 200 takes place within a sliding window 250 encompassing multiple data blocks at any given time. The sliding window 250 shown in FIG. 2 encompasses five data blocks; however, in various example embodiments, a sliding window may be used that encompasses a greater number of data blocks n≥5. Each data block within the sliding window 250 is decoded one or more times, typically in a predetermined order, before the sliding window 250 slides up and to the right such that the oldest k data blocks to the left and below exit the sliding window 250 and a new k blocks to the right and above are added to the sliding window 250, wherein 1 k n.

Example Error Correction Method Using Gated Decoder

As described above with reference to FIG. 5, a flexible, gated BCH3 decoder can be used to decode BCH1, BCH2, or BCH3 encoded coded bit sequences. Whereas the FEC encoder 112 may need to switch among three different generator matrices, the gated FEC decoder 142 may only need a single flexible, gated BCH3 decoder structure. In some embodiments, a flexible gated BCH3 decoder always uses $H_3$ as the parity check matrix to decode BCH1, BCH2, and BCH3 codewords. In some embodiments, a BCH3 syndrome generation module 302 may be used to generate the syndrome for BCH1 and BCH2 binary vectors using the single BCH parity check matrix $H_3$, with the third and/or second rows of the resulting syndrome being discarded or disregarded as appropriate.

Figure 6:
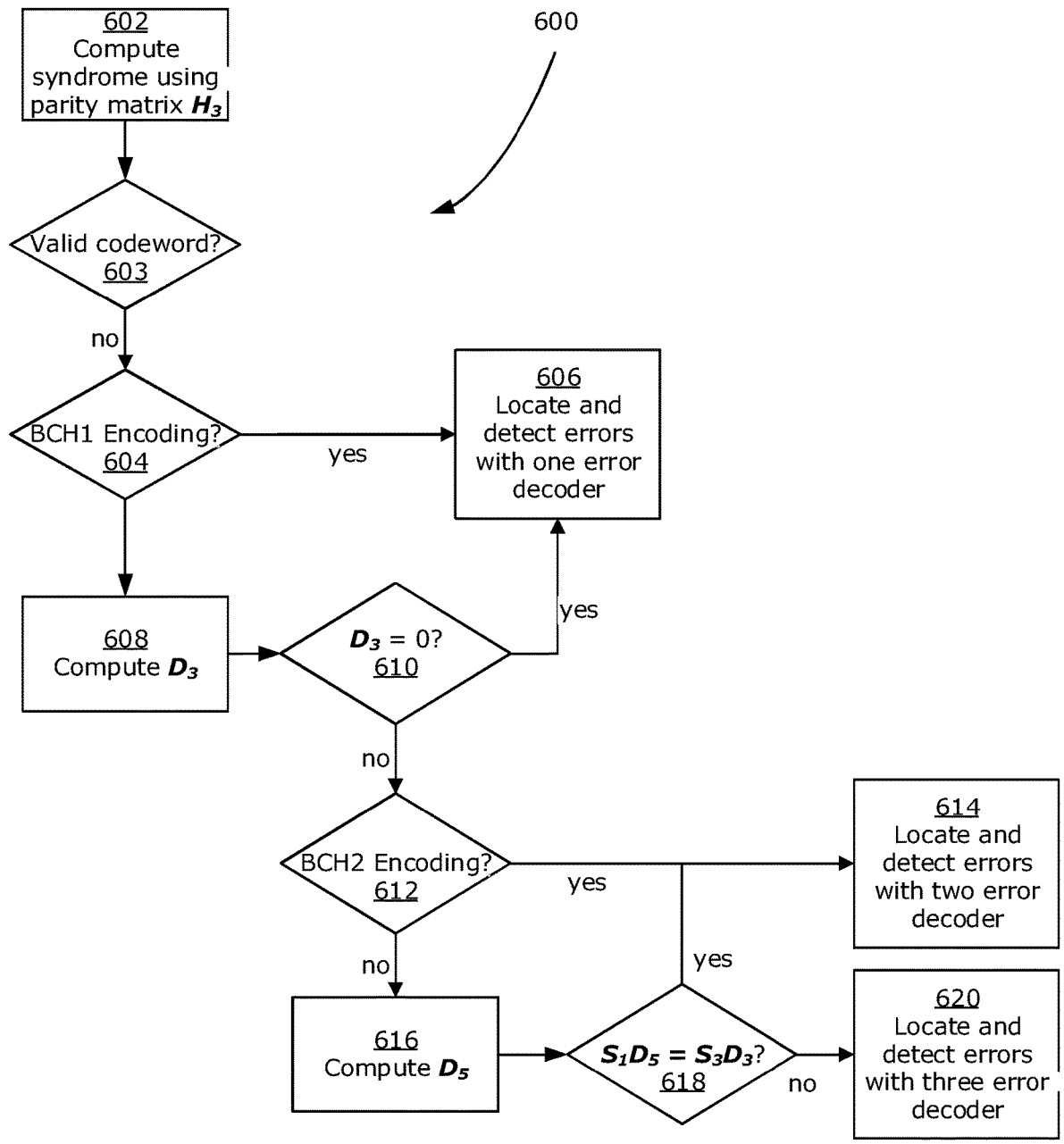
FIG. 6 is a flowchart of an example method for locating and correcting bit errors in an irregular ECC using a gated FEC decoder having three error decoder units, in accordance with examples described herein.

FIG. 6 shows a flowchart of an example method 600 for locating and correcting bit errors in a binary vector of an irregular ECC using a gated FEC decoder having three error decoder units corresponding to three encodings: BCH1, BCH2, and BCH3.

At 602, the syndrome generation module 302 calculates the syndrome for a row or column of a received data block. As described above with reference to FIG. 5, the binary vector is identified (comprising the row or column of the data block as well as a row or column of a prior data block) and multiplied by the transpose of the parity check matrix to generate the syndrome. In this case, the only parity check matrix used is the parity check matrix for BCH3, $H_3$. Thus, the generated syndrome always has three rows (in its numerical representation).

At 603, if the elements of the generated syndrome indicate that the binary vector is a valid codeword (as described above), no bit errors should be corrected in the binary vector and the next binary vector can be processed: the method 600 terminates for the current binary vector. However, in response to determining that the binary vector is not a valid codeword (i.e., determining that the binary vector contains one or more bit errors), the method 600 proceeds to step 604.

At 604, the syndrome decoder module 304 checks whether the current codeword is a codeword of the first encoding, i.e. BCH1 in this example. If so, the method 600 proceeds to step 606, otherwise to step 608.

At 606, up to one bit error is located and/or corrected in the codeword using the one bit error decoder 306. The first element of the syndrome $S_1$, is passed to the one bit error decoder 306 to locate the bit error.

At 608, $D_3$ is computed as described above with reference to FIG. 5.

At 610, the syndrome decoder module 304 checks whether $D_3$ is equal to zero. If so, the method 600 proceeds to step 606, otherwise to step 612.

At 612, the syndrome decoder module 304 checks whether the current codeword is a codeword of the second encoding, i.e. BCH2 in this example. If so, the method 600 proceeds to step 614, otherwise to step 616.

At 614, two bit errors are located and/or corrected in the codeword using the two bit error decoder 308. The first two elements of the syndrome $S_2$ and $S_3$ are passed to the two bit error decoder 308 to locate the bit errors.

At 616, $D_5$ is computed as described above with reference to FIG. 5.

At 618, the syndrome decoder module 304 checks whether $S_1 D_5$ is equal to $S_3 D_3$. If so, the method 600 proceeds to step 614, otherwise to step 620.

At 620, three bit errors are located and/or corrected in the codeword using the three bit error decoder 310. All three elements of the syndrome $S_2$, $S_3$, and $S_5$ are passed to the three bit error decoder 310 to locate the bit errors Thus, the gated syndrome decoder module 304 comprises a first decoder unit (one error decoder unit 306), a second decoder unit (two error decoder unit 308), and a third decoder unit (three error decoder unit 310). The gated syndrome decoder module 304 is configured, in response to the syndrome generation module 302 detecting one or more bit errors, to carry out the steps of method 600. If a first number (e.g., one) of bit errors are detected based on the syndrome, or if the parity bit sequence is encoded using a first encoding (e.g., BCH1), the gated syndrome decoder module 304 is configured to provide at least one element of the syndrome (e.g., the first element) to the first decoder unit, use the first decoder unit to locate the bit errors in the binary vector based on the syndrome, and correct the bit errors. If a second number (e.g., two) of bit errors are detected based on the syndrome, and if the parity bit sequence is encoded using a second encoding (e.g., BCH2), the second number being greater than the first number, the gated syndrome decoder module 304 is configured to provide at least two elements of the syndrome (e.g., the first two elements) to the second decoder unit, use the second decoder unit to locate the bit errors in the binary vector based on the syndrome, and correct the bit errors. In the example embodiment of method 600, if a third number (e.g., three) of bit errors are detected based on the syndrome, and if the parity bit sequence is encoded using a third encoding (e.g., BCH3), the third number being greater than the second number, the gated syndrome decoder module 304 is configured to provide at least three elements of the syndrome (e.g., all three elements) to the third decoder unit, use the third decoder unit to locate the bit errors in the binary vector based on the syndrome, and correct the bit errors.

Example Irregular Zipper Code

As noted above, a staircase code as shown in FIG. 2 is a special case of a zipper code. A zipper code is characterized by two major components: a zipping pair and an interleaver map.

A zipper code is composed of a sequence of codewords $c_0$, $c_1, \ldots$, wherein each $c_i$ is a codeword of a constituent code C(n, k, d), and wherein n, k, and d respectively denote the block length, dimension, and minimum Hamming distance of C. The sequence of codewords is called a buffer. One can denote the (i, j)-th entry of a buffer to be the j-th entry of the i-th codeword, wherein (i, j)∈ℤ×[n] and [n]={0, 1, . . . , n-1}. Now, let $m_0, m_1, \ldots$ be a sequence of integers such that for all i, $0 \leq m_i \leq k$. Denote $A_i = \{(i, j) : j \in [m_i]\}$, $B_i = \{(i, j) : j \in n \setminus [m_i]\}$, and $$A = U_i A_i, \quad B = U_i B_i.$$

A is called the virtual set and B is called the real set. Together, the pair (A,B) is called a zipping pair. The parameter $m_i$ is the width of virtual buffer at the i-th codeword. For a buffer with zipping pair (A,B), its entries are denoted by:

$$c_{A_i}=(c_{i,0}, \ldots ,c_{i,m_i-1}) \text{ and } c_{B_i}=(c_{i,m_i}, \ldots ,c_{i,n-1}).$$

Thus, $c_i=(c_{A_i}, c_{B_i}) \in C$ denotes the i-th codeword, the virtual buffer is the bit sequence $\{c_{A_i}\}$, and the real buffer is the bit sequence $\{c_{B_i}\}$.

Figure 7A:
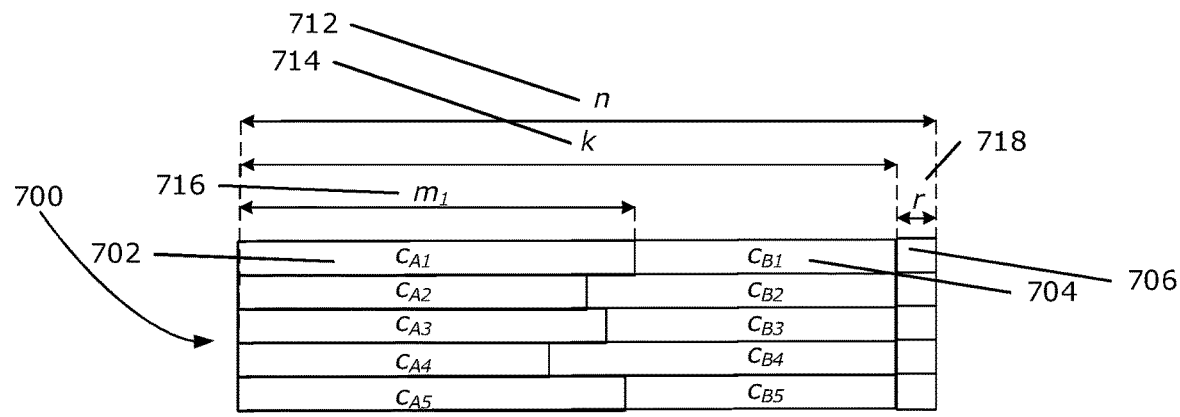
FIG. 7A is a visualization of a conventional zipper code.

FIG. 7A shows a visualization of an example zipper code 700. Each i-th row of the visualization corresponds to the i-th codeword. Thus, the first row consists of a virtual buffer 702, and a real buffer 704, the real buffer 704 including one or more parity bits 706. In a conventional zipper code, each codeword contains a fixed number of parity bits 706, shown here as bit length r 718. The entire codeword is of bit length n 712, and bit length k 714 is equal to the codeword length n 712 minus parity bit length r 718. The virtual buffer of the first codeword is of bit length $m_1$ 716; each subsequent codeword would have a bit length $m_2$, $m_3$, etc.

The set of virtual buffers ("virtual set") and set of real buffers ("real set") are populated with data bits as dictated by the second major component of the zipper code, the interleaver map. An interleaver map is defined as a function $$\Phi: A \rightarrow B$$

associating each bit in the virtual set with a bit in the real set. Every symbol in the virtual buffer is a duplicate of its associated symbol in the real buffer. In other words, in a valid codeword, for every (i,j)∈A, there exists a bit value $c_{i,j}=c_{\Phi(i,j)}$.

Encoding the i-th constituent code of a zipper code is performed in three steps. First, the bit positions of the real buffer 704 $c_{i,m_i}, \ldots, c_{i,n-r-1}$ are filled in with data bits from the data signal to be encoded. Second, the virtual buffer 702 is filled in by duplicating the symbols from the locations prescribed by the interleaver map, that is, for each $j \in A_i$, $c_{i,j}=c_{\Phi(i,j)}$. Third, the parity symbols $c_{i,n-r}, \ldots, c_{i,n-1}$ are computed using $(c_{i,0}, \ldots, c_{i,n-r-1})$ (i.e. the duplicate bits of virtual buffer 702 and the data bits of the real buffer 704) as the information bits of the codeword.

Various encodings may be used to calculate the parity bits of a zipper code. Also, various interleaver maps are possible. The presently described examples are not limited to any particular encodings scheme(s) or interleaver map.

A sequence of several sequential codewords may be transmitted together as a unit, comparable to a data block, sometime called a chunk. It will be appreciated that the set of virtual buffers 702 of a chunk of codewords of a zipper code 700 may, depending on the interleaver map used, contain data bits from the set of real buffers 704 from a prior chunk. Thus, the rows of the zipper code are encoded and decoded using the parity bits 706 to check for errors, not only in the data bits of the current row (i.e. real buffer 704) of the current data block (i.e. the current chunk), but also in one or more bits of a previous data block (i.e. a prior chunk) that are interleaved into the virtual buffer 702 of the current row. In this sense, the operation of the zipper code 700 is analogous to the operation of the staircase code, in which a given codeword in a given data block uses its parity bits to check for errors, not only in the data bits of the current row or column of the current data block, but also in data bits of a prior data block.

The techniques described above with respect to the flexible irregular staircase code 200 may be applied equally to a zipper code. When multiple different encodings, such as BCH1/2/3 codes, are used as the component codes for a zipper code, one may apply the same ideas described above to construct flexible irregular zipper codes with tunable overhead. The component codes can choose from BCH1, BCH2, and BCH3 codewords all having the same block length. The proportions of these three different codewords within a given chunk are adjustable based on the target overhead. The flexible BCH3 decoder design described above with reference to method 600 of FIG. 6 can be used for flexible decoding (for both hard-decoding and soft-decoding).

Figure 7B:
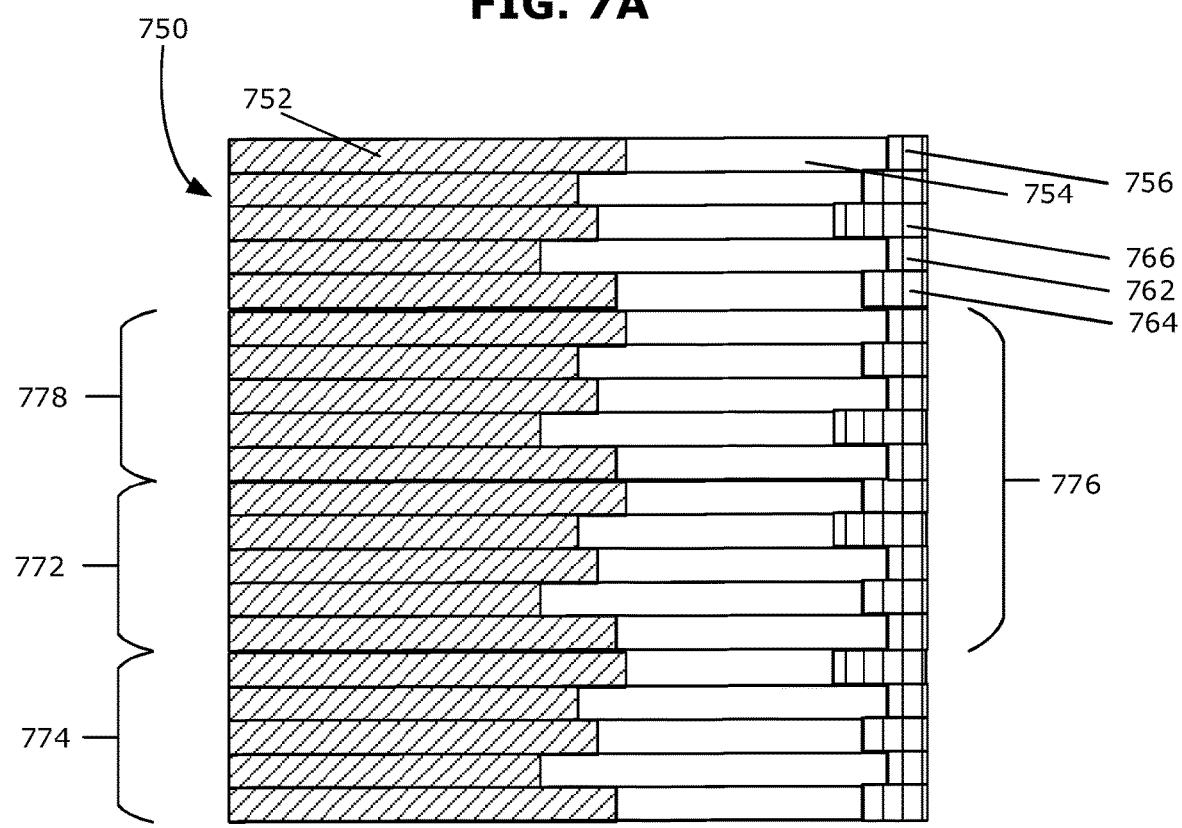
FIG. 7B is a visualization of a flexible irregular zipper code used for forward error correction, in accordance with examples described herein.

FIG. 7B shows a visualization of an example flexible irregular zipper code 750. A first codeword (i.e. row) of the irregular zipper code 750 consists of a virtual buffer 752 and a real buffer 754. Unlike the conventional zipper code 700, however, each codeword contains a variable number of parity bits 756, representing two or more different encodings used for the codewords. Here, three encodings are shown: a first encoding 762 (e.g. BCH1), a second encoding 764 (e.g. BCH2), and a third encoding 766 (e.g. BCH3). As in the case of the staircase code 200 of FIG. 2, three encodings are shown, but the number of encodings may be any number two or more.

The process of encoding and/or decoding takes place over a sliding window 776, which may indicate the number of rows within which bits are interleaved by the interleaving map; i.e., if the sliding window is M rows tall, then a bit located within the real buffer of a row i must be duplicated in the virtual buffer of a row numbered between i−M and i+M. The sliding window 776 will encompass multiple chunks. A current chunk 772 (i.e. the chunk currently being encoded) is shown, as is a future chunk 774 yet to be encoded.

All of the techniques described above, e.g. those with respect to coordinating the distribution of codewords of each encoding within a data block (i.e. a chunk), may be equally applied to the irregular zipper code 752. Rather than rows of row-wise data blocks and columns of column-wise data blocks, a single real buffer 754 of the zipper code 750 may be referred to as a coded bit sequence containing parity bits and data bits. Each codeword contains not only the coded bit sequence (i.e. real buffer 754), but also a virtual buffer 752 that may contain one or more bits from a prior data block (i.e. a prior chunk, such as prior chunk 778).

Thus, to encode the irregular zipper code 750 in some embodiments, a FEC encoder receives a digital data signal comprising a plurality of data bits and generates a FEC enabled data signal, namely the irregular zipper code 750. The FEC enabled data signal comprises a sequence of data blocks, namely chunks of the zipper code 750. Each data block comprises a plurality of coded bit sequences (i.e. real buffers 754). Each coded bit sequence comprises a data bit sequence (i.e. the non-parity bits of the real buffer 754) comprising one or more of the data bits from the received digital data signal, and a parity bit sequence comprising one or more parity bits 756. Each parity bit sequence is based on its respective data bit sequence (i.e. the rest of the real buffer 754) and, in some examples, one or more bits of a prior data block, e.g., interleaved duplicate bits from prior chunk 778.

Each data block includes at least one parity bit sequence of a first encoding 762 and at least one parity bit sequence of a second encoding 764. Each parity bit sequence of the first encoding 762 has a first predetermined number of parity bits, and each parity bit sequence of the second encoding 764 has a second predetermined number of parity bits greater than the first predetermined number (e.g., BCH2 has a greater number of parity bits per codeword than BCH1).

Once the FEC-enabled data signal has been generated, it is transmitted as described above with reference to the staircase code 200.

To decode the irregular zipper code 750 in some embodiments, a FEC decoder receives a FEC enabled received signal comprising a sequence of data blocks (i.e., chunks of the zipper code 750) as described above. For each coded bit sequence (i.e. real buffer 754) of each received data block, the FEC decoder performs a parity check using the parity bit sequence 756 of the coded bit sequence 754 to detect, in some examples, at least one bit error in a prior data block, e.g., a bit error in prior chunk 778.

Example Irregular oFEC Code

Similar techniques can be applied to oFEC (Open Forward Error Correction) codes, another special case of zipper codes. Similar to staircase codes, oFEC codes can also use BCH codes as the component codes. Each bit is protected by two component codes, and they form a convolutional structure, just like the zipper codes and staircase codes described above. Instead of using hard-decoding, oFEC performs Chase-based soft-decoding, and uses sub-block permutation to increase the minimum distance. As a result, oFEC codes may have a higher input BER threshold compared to staircase codes with the same overhead.

One may construct an irregular oFEC by using three different component BCH codes (e.g., BCH1, BCH2, and BCH3) with the same block length, similar to the techniques described above with reference to irregular staircase code 200 and irregular zipper code 750. The Chase-based soft-decoding also utilizes hard-decision BCH decoders. One may replace the hard-decision BCH decoders in an oFEC decoder with the flexible BCH3 decoder described above with reference to FIG. 6 to obtain a flexible oFEC decoder that can be used to decode BCH1, BCH2, and BCH3 component codes.

Figure 8:
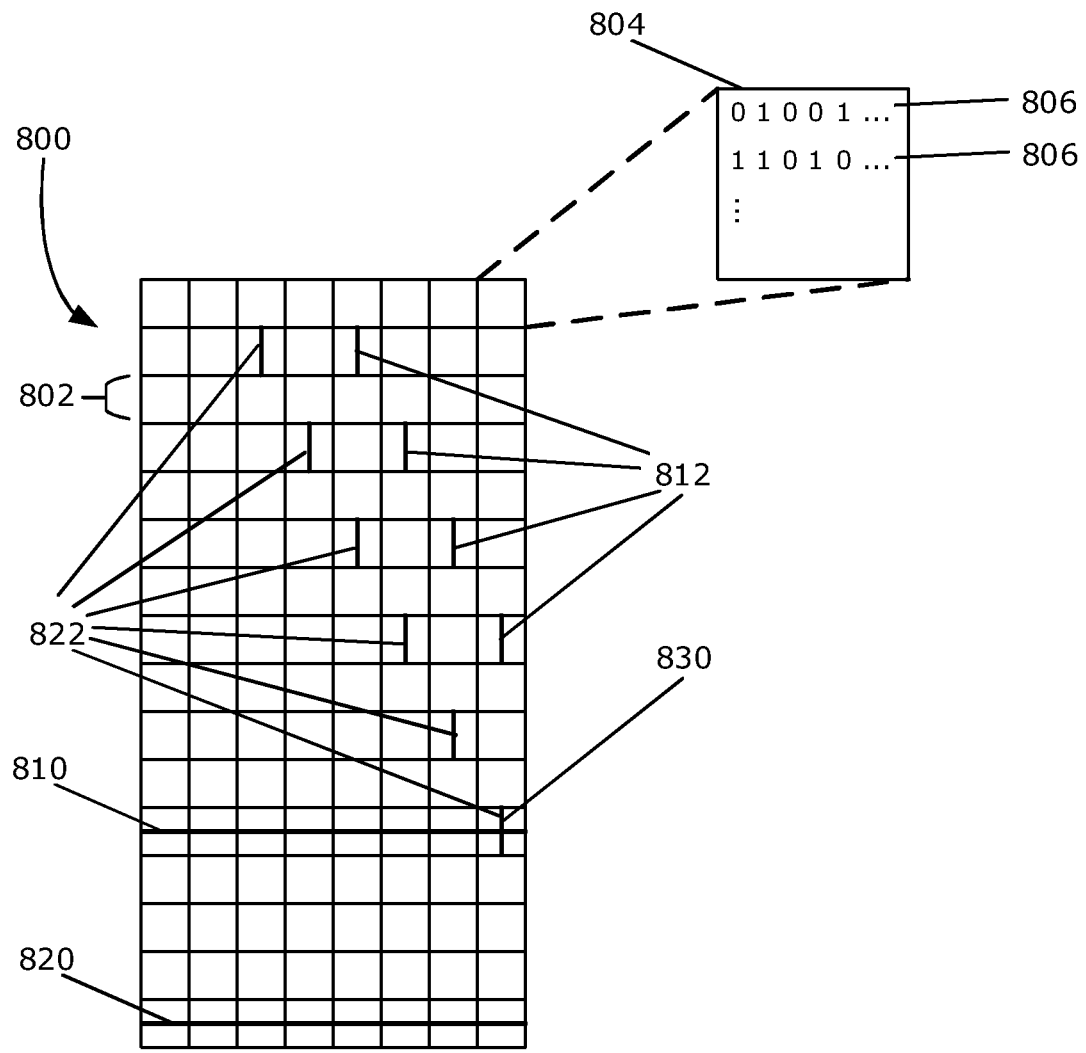
FIG. 8 is a schematic diagram of a flexible irregular oFEC code used for forward error correction with an expanded detail view of a single block of a block row, in accordance with examples described herein.

FIG. 8 shows an example irregular oFEC code 800 using codewords of multiple encodings in varying proportions to achieve tunable FEC overhead levels, as with the irregular staircase code 200 and irregular zipper code 750 described above. The irregular oFEC code 800 consists of codewords spread out over multiple data blocks. Instead of row-wise and column-wise data blocks in a staircase code or chunks with interleaved duplicate bits in the zipper code, the data blocks of the oFEC code 800 may be regarded as "block rows", each block row consisting of a number of blocks 804, each block consisting of a number of bit rows 806.

A codeword of the irregular oFEC code 800 consists of a horizontal bit row 804 spanning an entire block row, and multiple vertical segments located in blocks 804 of prior block rows 802. A first codeword is shown consisting of horizontal bit row 810 and multiple vertical segments 812. A second codeword is shown consisting of horizontal bit row 820 and multiple vertical segments 822. It will be appreciated that the vertical segments are defined by bits spanning multiple prior horizontal bit rows of prior codewords, such as the first vertical segment 830 of the second codeword intersecting with the horizontal bit row 810 of the first codeword. This is analogous to the intersection of a codeword (e.g. a row-wise codeword) of a current data block of the staircase code 200 with multiple codewords (e.g. column-wise codewords) of a prior block.

By using codewords with variable numbers of parity bits (not shown) corresponding to multiple encodings (e.g., BCH1, BCH2, and BCH3), the irregular oFEC code 800 can implement the techniques described above with respect to the irregular zipper code 750.

A flexible irregular oFEC design like the irregular oFEC code 800 may have all the benefits of the flexible irregular staircase code 200. Compared to staircase codes, oFEC codes may offer stronger protection to the bits due to their soft-decoding and increased minimum distance, at the cost of higher decoding complexity.

General

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processor device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A method comprising:
   receiving, at a forward error correction (FEC) encoder of a transmitter, a digital data signal comprising a plurality of data bits;
   generating, at the FEC encoder, a FEC enabled data signal encoded as a staircase code,
      the FEC enabled data signal comprising a sequence of data blocks alternating between row-wise data blocks and column-wise data blocks;
      each row-wise data block comprising a plurality of rows, the plurality of rows defining a plurality of columns, each row comprising:
         a data bit sequence comprising one or more of the data bits; and a parity bit sequence comprising one or more parity bits, each parity bit sequence being based on its respective data bit sequence and a corresponding row of a prior column-wise data block;

each column-wise data block comprising a plurality of columns, the plurality of columns defining a plurality of rows, each column comprising:

a data bit sequence comprising one or more of the data bits; and a parity bit sequence comprising one or more parity bits, each parity bit sequence being based on its respective data bit sequence and a corresponding column of a prior row-wise data block;

each data block including at least one parity bit sequence of a first encoding and at least parity bit sequence of a second encoding;

each parity bit sequence of the first encoding having a first predetermined number of parity bits;

each parity bit sequence of the second encoding having a second predetermined number of parity bits greater than the first predetermined number; and transmitting the FEC enabled data signal.

2. The method of claim 1, wherein at least one data block of the sequence of data blocks contains at least one parity bit sequence of a third encoding, each parity bit sequence of the third encoding having a third predetermined number of parity bits greater than the second predetermined number.

3. The method of claim 2, wherein each data block of the sequence of data blocks includes:

a first number of parity bit sequences of the first encoding;

a second number of parity bit sequences of the second encoding; and a third number of parity bit sequences of the third encoding, the first number, second number, and third number being determined based on a target error correction overhead level, the method further comprising:

receiving channel condition information;

updating the target error correction overhead level based on the channel condition information; and changing the first number, second number, and third number based on the updated target error correction overhead level.

4. The method of claim 3, wherein, for each data block, the parity bit sequences of each encoding are distributed among the rows or columns such that a number of adjacent parity bit sequences of the same encoding is minimized.

5. The method of claim 3, wherein:

each row-wise data block has the same distribution of parity bit sequences of each encoding among its rows; and each column-wise data block has the same distribution of parity bit sequences of each encoding among its columns.

6. The method of claim 2, further comprising generating a parity bit sequence in a row-wise data block by:

identifying a binary vector comprising:

an unknown parity bit sequence;

the data bits of the row of the parity bit sequence in the row-wise data block; and the bits of the corresponding row of the prior column-wise data block;

identifying a valid parity bit sequence such that, by setting the unknown parity bit sequence to the valid parity bit sequence and multiplying the binary vector by a transpose of a parity check matrix to generate a syndrome, the syndrome comprising a vector having a number of elements equal to a number of rows of the parity check matrix, each element of the syndrome is equal to zero; and setting the parity bit sequence to the valid parity bit sequence.

7. The method of claim 6, wherein:

the parity bit sequence is of the first encoding; and the parity check matrix comprises a one row matrix defined by a primitive element a of a Galois field such that:

the first element of the parity check matrix is one; and each subsequent element of the parity check matrix is a times the previous element.

8. The method of claim 6, wherein:

the parity bit sequence is of the second encoding; and the parity check matrix comprises a two row matrix defined by a primitive element a of a Galois field such that:

the first element of the first row of the parity check matrix is one;

each subsequent element of the first row of the parity check matrix is a times the previous element;

the first element of the second row of the parity check matrix is one; and each subsequent element of the second row of the parity check matrix is $a^3$ times the previous element.

9. The method of claim 6, wherein:

the parity bit sequence is of the third encoding; and the parity check matrix comprises a three row matrix defined by a primitive element a of a Galois field such that:

the first element of the first row of the parity check matrix is one;

each subsequent element of the first row of the parity check matrix is a times the previous element;

the first element of the second row of the parity check matrix is one;

each subsequent element of the second row of the parity check matrix is $a^3$ times the previous element;

the first element of the third row of the parity check matrix is one; and each subsequent element of the third row of the parity check matrix is $a^5$ times the previous element.

10. The method of claim 1, further comprising:

receiving, at a forward error correction (FEC) decoder of a receiver, the FEC enabled data signal; and for each row of each data row-wise block of the FEC enabled data signal, performing, at the FEC decoder, a parity check using the parity bit sequence of the row to detect at least one bit error in a prior data block of the FEC enabled data signal for each column of each column-wise data block of the FEC enabled data signal, performing, at the FEC decoder, a parity check using the parity bit sequence of the column to detect at least one bit error in a prior data block of the FEC enabled data signal.

11. The method of claim 10, wherein at least one data block of the sequence of data blocks contains at least one parity bit sequence of a third encoding, each parity bit sequence of the third encoding having a third predetermined number of parity bits greater than the second predetermined number.

12. The method of claim 11, wherein:

each row-wise data block has the same distribution of parity bit sequences of each encoding among its rows; and each column-wise data block has the same distribution of parity bit sequences of each encoding among its columns.

13. The method of claim 11, wherein detecting a bit error in the corresponding row of the prior column-wise data block using a parity bit sequence comprises:
    identifying a binary vector comprising:
        the parity bit sequence;
        the data bits of the row of the row-wise data block; and
        the bits of the corresponding row of the prior column-wise data block;
    multiplying the binary vector by a transpose of a parity check matrix to generate a syndrome, the syndrome comprising a vector having a number of elements equal to a number of rows of the parity check matrix; and
    based on the elements of the syndrome, determining that the binary vector contains at least one bit error.

14. The method of claim 13, wherein:
    the parity bit sequence is of the first encoding; and
    the parity check matrix comprises a one row matrix defined by a primitive element a of a Galois field such that:
        the first element of the parity check matrix is one; and
        each subsequent element of the parity check matrix is a times the previous element,
    the method further comprising, in response to determining that the first element of the syndrome is not zero, using a syndrome decoder module of the FEC decoder to correct the one or more detected errors, the syndrome decoder module being configured to:
        provide the first element of the syndrome to a one-error decoder unit of the FEC decoder;
        use the one-error decoder unit to locate a single bit error in the binary vector based on the first element of the syndrome; and
        correct the single bit error.

15. The method of claim 13, wherein:
    the parity bit sequence is of the second encoding; and
    the parity check matrix comprises a two row matrix defined by a primitive element a of a Galois field such that:
        the first element of the first row of the parity check matrix is one;
        each subsequent element of the first row of the parity check matrix is a times the previous element;
        the first element of the second row of the parity check matrix is one; and
        each subsequent element of the second row of the parity check matrix is $a^3$ times the previous element,
    the method further comprising, in response to determining that the first element or second element of the syndrome is not zero, using a syndrome decoder module of the FEC decoder to correct the one or more detected errors, the syndrome decoder module being configured to:
        calculate a value $D_3$ by adding the cube of the first element of the syndrome to the second element of the syndrome;
        if $D_3$ is zero:
            provide the first element of the syndrome to a one-error decoder unit of the FEC decoder;
            use the one-error decoder unit to locate a single bit error in the binary vector based on the first element of the syndrome; and
            correct the single bit error; and
        if $D_3$ is not zero:
            provide the first and second elements of the syndrome to a two-error decoder unit of the FEC decoder;
            use the two-error decoder unit to locate two bit errors in the binary vector based on the first element of the syndrome; and
            correct the two bit errors.

16. The method of claim 11, wherein:
    the parity bit sequence is of the third encoding; and
    the parity check matrix comprises a three row matrix defined by a primitive element a of a Galois field such that:
        the first element of the first row of the parity check matrix is one;
        each subsequent element of the first row of the parity check matrix is a times the previous element;
        the first element of the second row of the parity check matrix is one;
        each subsequent element of the second row of the parity check matrix is $a^3$ times the previous element;
        the first element of the third row of the parity check matrix is one; and
        each subsequent element of the third row of the parity check matrix is $a^5$ times the previous element;
    the method further comprising, in response to determining that any of the three elements of the syndrome is not zero, using a syndrome decoder module of the FE decoder to correct the one or more detected errors, the syndrome decoder module being configured to:
        calculate a value $D_3$ by adding the cube of the first element of the syndrome to the second element of the syndrome;
        if $D_3$ is zero:
            provide the first element of the syndrome to a one-error decoder unit of the FEC decoder;
            use the one-error decoder unit to locate a single bit error in the binary vector based on the first element of the syndrome; and
            correct the single bit error; and
        if $D_3$ is not zero:
            calculate a value $D_5$ by adding the first element of the syndrome, raised to the fifth power, to the third element of the syndrome;
            if the first element of the syndrome, multiplied by $D_5$, is equal to the second element of the syndrome, multiplied by $D_3$:
                provide the first and second elements of the syndrome to a two-error decoder unit of the FEC decoder;
                use the two-error decoder unit to locate two bit errors in the binary vector based on the first and second elements of the syndrome; and
                correct the two bit errors; and
            if:
                the first element of the syndrome, multiplied by $D_5$, is not equal to the second element of the syndrome, multiplied by $D_3$; or
                the first element of the syndrome is equal to zero:
                    provide the first, second, and third elements of the syndrome to a three-error decoder unit of the FEC decoder;
                    use the three-error decoder unit to locate three bit errors in the binary vector based on the first, second, and third elements of the syndrome; and
                    correct the three bit errors.

17. The method of claim 16, wherein the syndrome decoder module is a gated syndrome decoder module further configured to detect and correct bit errors in the data bit sequence of a row of a row-wise data block or in the corresponding row of the prior column-wise data block using a parity bit sequence of the first encoding or second encoding.

18. A transmitter, comprising:
a forward error correction (FEC) encoder configured to:
receive, at a forward error correction (FEC) encoder of a transmitter, a digital data signal comprising a plurality of data bits;
generate, at the FEC encoder, a FEC enabled data signal encoded as a staircase code,
the FEC enabled data signal comprising a sequence of data blocks alternating between row-wise data blocks and column-wise data blocks;
each row-wise data block comprising a plurality of rows, the plurality of rows defining a plurality of columns, each row comprising:
a data bit sequence comprising one or more of the data bits; and
a parity bit sequence comprising one or more parity bits, each parity bit sequence being based on its respective data bit sequence and a corresponding row of a prior column-wise data block;
each column-wise data block comprising a plurality of columns, the plurality of columns defining a plurality of rows, each column comprising:
a data bit sequence comprising one or more of the data bits; and
a parity bit sequence comprising one or more parity bits, each parity bit sequence being based on its respective data bit sequence and a corresponding column of a prior row-wise data block;
each data block including at least one parity bit sequence of a first encoding and at least parity bit sequence of a second encoding;
each parity bit sequence of the first encoding having a first predetermined number of parity bits;
each parity bit sequence of the second encoding having a second predetermined number of parity bits greater than the first predetermined number; and
transmit the FEC enabled data signal.

* * * * *